United States Patent
Song et al.

(10) Patent No.: US 10,355,050 B2
(45) Date of Patent: Jul. 16, 2019

(54) SEMICONDUCTOR MEMORY DEVICE

(71) Applicant: Samsung Electronics Co., Ltd., Suwon-si, Gyeonggi-do (KR)

(72) Inventors: Seul-ji Song, Yongin-si (KR); Jung-hoon Park, Yongin-si (KR); Sung-ho Eun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/006,314

(22) Filed: Jun. 12, 2018

(65) Prior Publication Data

US 2019/0140021 A1 May 9, 2019

(30) Foreign Application Priority Data

Nov. 9, 2017 (KR) .................. 10-2017-0148722

(51) Int. Cl.
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/06* (2013.01); *H01L 45/126* (2013.01); *H01L 45/1233* (2013.01); *H01L 45/144* (2013.01); *H01L 45/1683* (2013.01)

(58) Field of Classification Search
CPC ............ H01L 27/2463; H01L 27/2427; H01L 45/126; H01L 45/1233
See application file for complete search history.

(56) References Cited

U.S. PATENT DOCUMENTS

| | | | |
|---|---|---|---|
| 8,120,068 B2* | 2/2012 | Scheuerlein | G11C 13/0004 257/211 |
| 8,634,236 B2* | 1/2014 | Park | H01L 45/06 257/112 |
| 8,802,453 B2 | 8/2014 | Lee | |
| 2011/0057161 A1 | 3/2011 | Sandhu | |
| 2012/0305875 A1 | 12/2012 | Shim | |
| 2013/0302966 A1 | 11/2013 | Oh | |
| 2017/0117327 A1 | 4/2017 | Terai | |
| 2017/0244031 A1* | 8/2017 | Jeong | H01L 45/04 |

FOREIGN PATENT DOCUMENTS

| | | |
|---|---|---|
| KR | 1020060079455 | 7/2006 |
| KR | 1020090020826 | 2/2009 |
| KR | 1020110035784 | 4/2011 |

* cited by examiner

*Primary Examiner* — Allison Bernstein
(74) *Attorney, Agent, or Firm* — Myers Bigel, P.A.

(57) ABSTRACT

A memory device includes first conductive lines extending on a substrate along a first direction; second conductive lines extending on the first conductive lines along a second direction intersecting with the first direction; and memory cell structures, which are at intersections between the first conductive lines and the second conductive lines and connected to the first conductive lines and the second conductive lines, each of the memory cell structures including a first electrode layer, a second electrode layer, and a resistive memory layer between the first electrode layer and the second electrode layer. A first sidewall of each of the resistive memory layers is sloped and has a horizontal width that decreases in a direction away from the substrate, and a second sidewall of each of the resistive memory layer adjacent to the first sidewall is sloped and has a horizontal width that increases in a direction away from the substrate.

18 Claims, 28 Drawing Sheets

SEMICONDUCTOR MEMORY DEVICE

CROSS-REFERENCE TO RELATED APPLICATION

This application claims the benefit of Korean Patent Application No. 10-2017-0148722, filed on Nov. 9, 2017, in the Korean Intellectual Property Office, the content of which is hereby incorporated herein by reference in its entirety.

BACKGROUND

The inventive concept relates, generally, to a memory device, and, more particularly, to a memory device having a cross-point array structure.

There is growing demand for high integration of semiconductor devices along with miniaturization of electronic products. As a next generation non-volatile memory device, a memory device that stores data by changing the resistance of a resistive memory layer has been used in some electronic products. Furthermore, as there is continuous demand for increased integration and downscaling of memory devices, a memory device having a cross-point stacked structure in which a memory cell is provided at an intersection between two electrodes intersecting each other has also been used in some electronic products.

SUMMARY

Some embodiments of the inventive concept may provide a memory device having a cross-point stacked structure that may be implemented through a simplified process for improved reliability.

According to an aspect of the inventive concept, there is provided a memory device including first conductive lines extending on a substrate along a first direction; second conductive lines extending on the first conductive lines along a second direction intersecting with the first direction; and memory cell structures, which are at intersections between the first conductive lines and the second conductive lines and connected to the first conductive lines and the second conductive lines, each of the memory cell structures including a first electrode layer, a second electrode layer, and a resistive memory layer between the first electrode layer and the second electrode layer, wherein a first sidewall of each of the resistive memory layers is sloped and has a horizontal width that decreases in a direction away from the substrate, and wherein a second sidewall of the resistive memory layer adjacent to the first sidewall is sloped and has a horizontal width that increases in a direction away from the substrate.

According to another aspect of the inventive concept, there is provided a memory device including a first conductive line extending on a substrate along a first direction; a pair of second conductive lines extending on the first conductive line along a second direction intersecting with the first direction; a pair of memory cell structures, which are at intersections between the first conductive line and the pair of second conductive lines; a first one of the pair of memory cell structures including a first resistive memory layer; a second one of the pair of memory cell structures including a second resistive memory layer; and a first electrode layer, which is shared by the pair of memory cell structures and completely covers bottom surfaces of the first resistive memory layer and the second resistive memory layer.

According to another aspect of the inventive concept, there is provided a memory device including first conductive lines extending on a substrate along a first direction; second conductive lines extending on the first conductive lines along a second direction intersecting with the first direction; third conductive lines extending on the second conductive lines along the first direction; and memory cell structures and selecting device structures, respectively including resistive memory layers and select device layers, at intersections between the first conductive lines and the second conductive lines and at intersections between the second conductive lines and the third conductive lines and connected to each other in series, wherein first sidewalls of the resistive memory layers are sloped sidewalls whose horizontal widths increase in a direction away from the substrate, and wherein sidewalls of the select device layers are sloped sidewalls whose horizontal widths decrease in a direction away from the substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
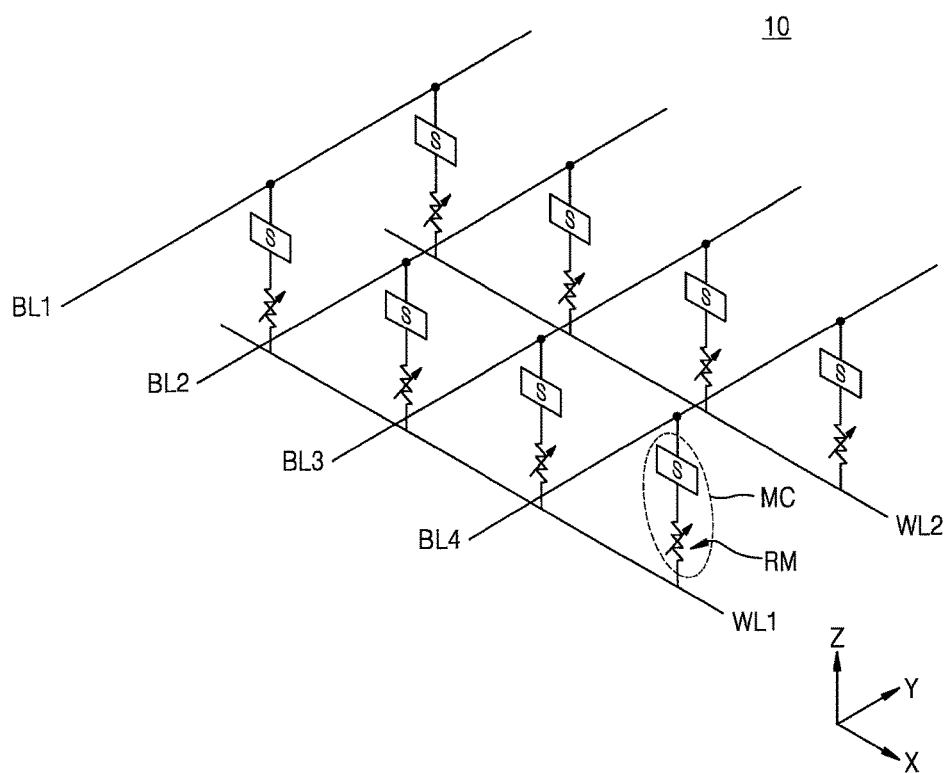
FIG. 1 is an equivalent circuit diagram of a portion of a memory device according to some embodiments of the inventive concept.

Various example embodiments will now be described more fully hereinafter with reference to the accompanying drawings. Like reference numerals refer to like elements throughout this application.

Some embodiments of the inventive concept stem from a realization that when a heating electrode is used as a bottom electrode of a resistive memory layer, a contact area between the resistive memory layer and the heating electrode may be relatively small, which may result in the phase change of the resistive memory layer occurring at a portion of the resistive memory layer that is relatively close to the heating electrode. Moreover, when forming a three-dimensional cross-point stacked memory device structure, interlayer word lines and/or bit lines may be shared for simplification during manufacturing and/or increased integration. The directions of the interlayer dynamic currents, however, may oppose each other. As a result, interlayer operation currents may be asymmetric due to the Peltier effect based on the asymmetry of a top electrode and a bottom electrode of a resistive memory layer. Some embodiments of the inventive concept may provide a semiconductor memory device that in the top and bottom electrodes on opposite sides of a resistive memory layer have symmetrical structures. This may allow a phase change to be induced by Joule heat generated by a current passing through the resistive memory layer without the need for a heating electrode. Moreover, asymmetrical interlayer operating currents may be reduced or prevented. In some embodiments, by forming the resistive memory layer through a damascene process, the resistive memory layer may have sidewalls that are sloped in a direction different from that of a selective element layer formed through a dry etching process.

FIG. 1 is an equivalent circuit diagram of a portion of a memory device according to some embodiments of the inventive concept.

Referring to FIG. 1, a memory device 10 includes a plurality of word lines WL1 and WL2 extending along a first direction (X direction) and being spaced apart from each other along a second direction (Y direction) and a plurality of bit lines BL1, BL2, BL3, and BL4 that are spaced apart from the plurality of word lines WL1 and WL2 along a third direction (Z direction), extend along the second direction, and are spaced apart from one another along the second direction.

The memory device 10 may include a plurality of memory cells MC respectively arranged at intersections between the plurality of word lines WL1 and WL2 and the plurality of bit lines BL1, BL2, BL3, and BL4. Each of the plurality of memory cells MC may include a resistive memory layer RM for storing information and a select device layer S for selecting a memory cell. The resistive memory layer RM may be electrically connected to any one word line of the plurality of word lines WL1 and WL2, and the select device layer S may be electrically connected to any one bit line of the plurality of bit lines BL1, BL2, BL3, and BL4, wherein the resistive memory layer RM may be connected to the select device layer S in series. However, the embodiments of the inventive concept are not limited thereto, and the resistive memory layer RM may be connected to a bit line and the select device layer S may be connected to a word line.

To operate the memory device 10, a voltage is applied to the resistive memory layer RM of the memory cells MC through the plurality of word lines WL1 and WL2 and the plurality of bit lines BL1, BL2, BL3, and BL4, which may cause current to flow in the resistive memory layer RM. An arbitrary memory cell MC may be addressed by selecting the word lines WL1 and WL2 and the bit lines BL1, BL2, BL3, and BL4, and the memory cell MC may be programmed by applying certain signals between the word lines WL1 and WL2 and the bit lines BL1, BL2, BL3, and BL4. Furthermore, by measuring currents through the bit lines B1, BL2, BL3, and BL4, information, e.g., programmed information, regarding resistance values of resistive memory layers of corresponding memory cells MC may be read.

Figure 2:
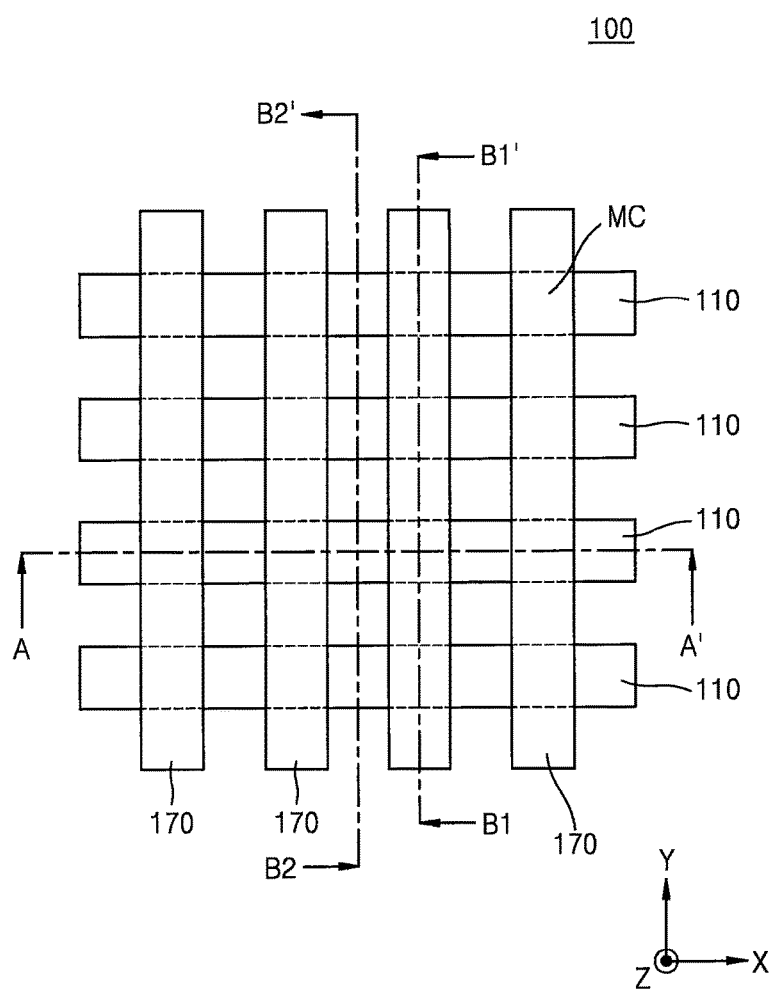
FIG. 2 is a plan view diagram schematically showing parts of a memory device according to some embodiments of the inventive concept.
Figure 3A:
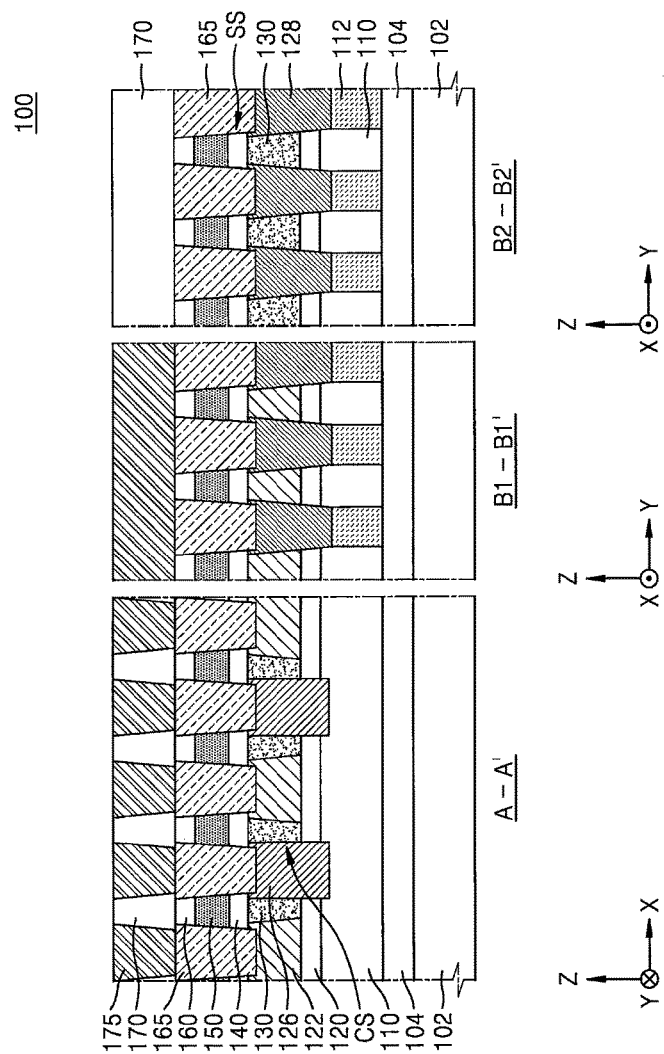
FIG. 3A is a cross-sectional view of a memory device according to some embodiments of the inventive concept taken along lines A-A1', B1-B1', and B2-B2' of FIG. 2.
Figure 3B:
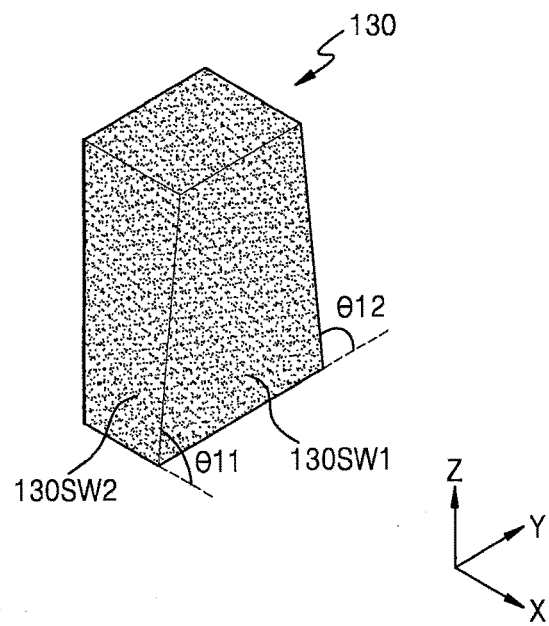
FIG. 3B is a schematic perspective view of a resistive memory layer of the memory device of FIG. 3A.
Figure 3C:
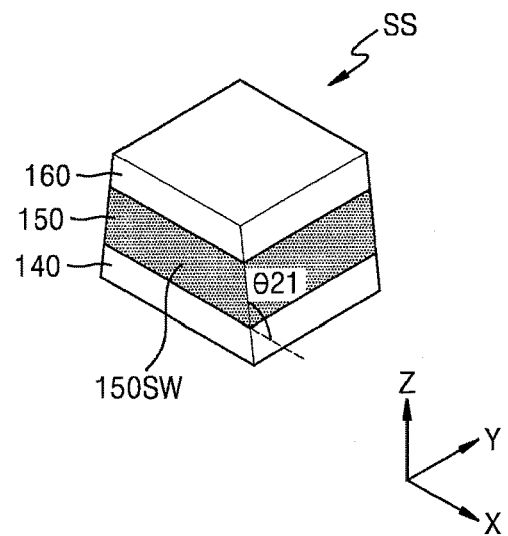
FIG. 3C is a schematic perspective view of a select device structure including a select device layer of FIG. 3A.

FIGS. 2 through 3C are diagrams that illustrate memory devices according to some embodiments of the inventive concept. FIG. 2 is a plan view diagram schematically showing parts of memory devices according to some embodiments of the inventive concept. FIG. 3A is a cross-sectional view of memory devices according to some embodiments of the inventive concept, taken along lines A-A1', B1-B1', and B2-B2' of FIG. 2. FIG. 3B is a schematic perspective view of a resistive memory layer of the memory device of FIG. 3A. FIG. 3C is a schematic perspective view of a select device structure including a select device layer of FIG. 3A.

Referring to FIGS. 2 and 3A, a memory device 100 includes a plurality of first conductive lines 110 extending in parallel with one another in a first direction (X direction) and a plurality of second conductive lines 170 extending in parallel with one another in a second direction (Y direction) intersecting the first direction. According to some embodiments, an example where the first direction (X direction) and the second direction (Y direction) are mutually orthogonal with each other will be described, but embodiments of the inventive concept are not limited thereto.

A substrate 102 may include a semiconductor material. The substrate 102 may include at least one material selected from Group III-V materials and Group IV materials. The substrate 102 may include, for example, silicon (Si). In other embodiments, the substrate 102 may include a semiconductor material like germanium (Ge) or a compound semiconductor material like silicon germanium (SiGe), silicon carbide (SiC), gallium arsenide (GaAs), indium arsenide (InAs), and indium phosphide (InP). According to some embodiments, the substrate 102 may have a silicon-on-insulator (SOI) structure or a germanium-on-insulator (GOI) structure. For example, the substrate 102 may include a buried oxide (BOX) layer. The substrate 102 may include a conductive region, e.g., a well doped with an impurity.

An interlayer insulation film 104 may be disposed on the substrate 102. The interlayer insulation film 104 may electrically isolate the plurality of first conductive lines 110 from the substrate 102 and may include an oxide, a nitride, or a combination thereof.

According to some embodiments, the plurality of first conductive lines 110 may constitute the plurality of word lines WL1 and WL2 shown in FIG. 1, and the plurality of second conductive lines 170 may constitute the plurality of bit lines BL1, BL2, BL3, and BL4 shown in FIG. 1. According to other embodiments, the plurality of first conductive lines 110 may constitute the plurality of bit lines BL1, BL2, BL3, BL4, and the plurality of second conductive lines 170 may constitute the plurality of word lines WL1 and WL2. A plurality of first separating insulation patterns 112 may be formed between the plurality of first conductive lines 110, and a plurality of second separating insulation patterns 175 may be formed between the plurality of second conductive lines 170. The plurality of first separating insulation patterns 112 and the plurality of second separating insulation patterns 175 may include silicon oxide, silicon nitride, or a combination thereof.

The plurality of first conductive lines 110 and the plurality of second conductive lines 170 may include a metal, a conductive metal nitride, a conductive metal oxide, or a combination thereof. The plurality of first conductive lines 110 and the plurality of second conductive lines 170 may each include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, an alloy thereof, or a combination thereof. The plurality of first conductive lines 110 and the plurality of second conductive lines 170 may each further include a conductive barrier film. The conductive barrier film may include, for example, Ti, TiN, Ta, TaN, or a combination thereof.

Memory cell structures CS constituting memory cells (MC in FIG. 1) may be disposed at respective intersections between the plurality of first conductive lines 110 and the plurality of second conductive lines 170.

Each of a plurality of memory cell structures CS may include a first electrode layer 120, a resistive memory layer 130, and a second electrode layer 140, which are sequentially stacked on the first conductive line 110. A plurality of resistive memory layers 130 included in the plurality of memory cell structures CS may be insulated from one another by a first insulation pattern 122, a second insulation pattern 126, and a third insulation pattern 128. The first insulation pattern 122, the second insulation pattern 126, and the third insulation pattern 128 may each include a nitride. According to some embodiments, the first insulation pattern 122, the second insulation pattern 126, and the third insulation pattern 128 may each include an oxide film and a nitride film surrounding the sidewalls of the oxide film.

Two opposite sidewalls of the resistive memory layer 130 may be in contact with the first insulation pattern 122 and the second insulation pattern 126, respectively, and the other two opposite sidewalls of the resistive memory layer 130 may be in contact with the third insulation pattern 128. The first insulation pattern 122 may have a tapered shape with a horizontal width decreasing in a direction away from the substrate 102.

According to some embodiments, the first insulation pattern 122, the second insulation pattern 126 and the resistive memory layer 130 may each have a pillar-like shape, and the third insulation pattern 128 may have a line-like shape. For example, the third insulation pattern 128 may be a plurality of patterns each having a line-like shape and extending in parallel with one another along the first direction (X direction). The first insulation pattern 122, the second insulation pattern 126, and the resistive memory layer 130 may be disposed between two adjacent third insulation patterns 128. For example, a plurality of resistive memory layers 130 may be disposed between two adjacent third insulation patterns 128 so as to be apart from one another in the first direction (X direction), and the first insulation pattern 122 and the second insulation pattern 126 may be alternately arranged between the plurality of resistive memory layers 130 apart from one another in the first direction (X direction). Sidewalls of the first insulation pattern 122, the second insulation pattern 126, and the resistive memory layer 130 facing the second direction (Y direction) may be in contact with the third insulation pattern 128.

The first electrode layer 120 may be disposed on the top surface of the first conductive line 110. A plurality of first electrode layers 120 may be disposed on the top surface of the first conductive line 110 so as to be apart from one another, wherein the second insulation pattern 126 is arranged between the plurality of first electrode layers 120. According to some embodiments, the second insulation pattern 126 may extend from the top of the first conductive line 110 into the first conductive line 110.

The first electrode layer 120 may include a metal, a metal nitride, an alloy, and/or a carbon-based conductive material. For example, the first electrode layer 120 may include TiN, TiSiN, TiAlN, TaSiN, TaAlN, TaN, WSi, WN, TiW, MoN, NbN, TiBN, ZrSiN, WSiN, WBN, ZrAlN, MoAlN, WON, TaON, C, SiC, SiCN, CN, TiCN, TaCN, or a combination thereof.

One first insulation pattern 122 and a pair of resistive memory layers 130 may be disposed on each of the plurality of first electrode layers 120. The pair of resistive memory layers 130 disposed on one of the plurality of first electrode layers 120 may be disposed on two opposite sidewalls of the one first insulation pattern 122. Therefore, a pair of memory cell structures CS between the first insulation patterns 122 may share one first electrode layer 120.

A plurality of second electrode layers 140 may be disposed on the plurality of resistive memory layers 130. The top surface of each of the plurality of resistive memory layers 130 may be covered by each of the plurality of second electrode layers 140, respectively.

In other words, bottom surfaces of a pair of resistive memory layers 130 included in each of a pair of memory cell structures CS respectively arranged at intersections between one first conductive line 110 extending in the first direction (X direction) and a pair of second conductive lines 170 extending in the second direction (Y direction) on a first conductive line 110 may together be completely covered by one first electrode layer 120, whereas top surfaces of the pair of resistive memory layers 130 may be covered by a pair of second electrode layers 140 apart from each other, respectively.

The second electrode layers 140 may include a metal, a metal nitride, an alloy, or a carbon-based conductive material. For example, the second electrode layers 140 may include W, Ti, Ta, Al, Cu, C, CN, TiN, TiAlN, TiCN, WN, TaN, TaCN, or a combination thereof.

The pair of resistive memory layers 130 may be disposed on the one first electrode layer 120. Meanwhile, a pair of second electrode layers 140 may be disposed on the pair of resistive memory layers 130. In other words, one memory cell structure CS and another memory cell structure CS share one first electrode layer 120. However, the one memory cell structure CS and the other memory cell structure CS do not share a second electrode layer 140 and include the second electrode layers 140 apart from each other, respectively.

The first electrode layer 120 and the second electrode layer 140 may completely cover the bottom surface and the top surface of the resistive memory layer 130, respectively.

A plurality of selecting device structures SS may be disposed on the plurality of memory cell structures CS. The selecting device structures SS may each include the second electrode layer 140, a select device layer 150, and a third electrode layer 160. One memory cell structure CS and one selecting device structure SS corresponding to each other may share one second electrode layer 140 and may be connected to each other in series.

The select device layer 150 may correspond to the select device layer S shown in FIG. 1. The select device layer 150 may include an amorphous chalcogenide switching material. The select device layer 150 may include a material layer whose resistance may vary according to the magnitude of voltages applied to both ends of the select device layer 150. For example, the select device layer 150 may include an Ovonic threshold switching (OTS) material. The OTS material may include a chalcogenide switching material. According to some embodiments, the select device layer 150 may include Si, Te, As, Ge, In, or a combination thereof. The select device layer 150 may further include nitrogen (N) atoms. However, materials constituting the select device layer 150 are not limited thereto, and the select device layer 150 may include various material layers capable of selecting a device. The detailed configuration of the third electrode layer 160 is substantially identical to that of the second electrode layer 140 described above.

The second electrode layer 140 and the third electrode layer 160 may cover the bottom surface and the top surface of the select device layer 150, respectively. According to some embodiments, the second electrode layer 140 and the third electrode layer 160 may completely cover the bottom surface and the top surface of the select device layer 150, respectively.

According to some embodiments, an interface layer may be interposed between the select device layer 150 and the second electrode layer 140 and/or between the select device layer 150 and the third electrode layer 160. The interface layer may include a conductive material, e.g., carbon (C).

The plurality of selecting device structures SS may be spaced apart from one another by an insulation film 165. The insulation film 165 may be in contact with the sidewalls of each of the plurality of selecting device structures SS. The top surface of the third electrode layer 160 and the top surface of the insulation film 165 may extend on a same plane. The insulation film 165 may include a nitride. According to some embodiments, the insulation film 165 may include an oxide film and a nitride film surrounding the sidewalls of the oxide film.

The plurality of second conductive lines 170 and a plurality of second separating insulation patterns 175 filling spaces between the plurality of second conductive lines 170 may be arranged on the third electrode layer 160 and the insulation film 165.

In the memory device 100, the memory cell structure CS and the selecting device structure SS may be arranged at each of intersections between the plurality of first conductive lines 110 and the plurality of second conductive lines 170

To operate the memory device 100, a voltage is applied to the resistive memory layer 130 of the memory cell structure CS via the selecting device structure SS selected by the first conductive line 110 and the second conductive line 170, which may cause current to flow in the resistive memory layer 130. An arbitrary memory cell structure CS may be addressed based on a selection of the first conductive line 110 and the second conductive line 170, and a programming signal may be applied between the first conductive line 110 and the second conductive line 170, thereby programming the memory cell structure CS. Furthermore, by measuring a current through the second conductive line 170, programmed information according to the resistance value of the resistive memory layer 130 of the memory cell structure CS may be read.

In the memory device 100, according to an example embodiment, a first electrode layer 120 and a second electrode layer 140 may completely cover the bottom surface and the top surface of the resistive memory layer 130, respectively, and, thus, the first electrode layer 120 and the second electrode layer 140 may have structures symmetric to each other around the resistive memory layer 130. Therefore, even when the first electrode layer 120 and the second electrode layer 140 are not heating electrodes capable of heating the resistive memory layer 130, the memory cell structure CS may be programmed by self-heat emission of the resistive memory layer 130, that is, the Joule heat from a current flowing through the resistive memory layer 130. Therefore, because the Peltier effect that may occur when an electrode of the memory cell structure CS has an asymmetric structure is reduced or minimized, deterioration of an operation current level may be reduced or minimized, thereby improving the operation stability of the memory device 100.

Furthermore, when a 3-dimensional cross-point stacked structure is formed by stacking the memory cell structures CS, there may be little to no asymmetry between operating current levels of the memory cell structures CS arranged at different layers, and, thus, the reliability of a memory device of having a 3-dimensional cross-point stacked structure may be improved.

Referring to FIGS. 3A and 3B, the resistive memory layer 130 may have a first sidewall 130SW1 contacting the first insulation pattern 122 and a second sidewall 130SW2 contacting the third insulation pattern 128. The first sidewall 130SW1 may be a sloped sidewall. According to some embodiments, the second sidewall 130SW2 may also be a sloped sidewall.

A first included angle θ11, which is the angle between the first sidewall 130SW1 and a horizontal plane parallel to a main surface (X-Y plane) of the substrate 102, may be an acute angle.

In the present specification, an inclusion angle between a sidewall and a horizontal plane refers to an outer angle between the sidewall and the horizontal plane. For example, the first included angle θ11 may be an angle between the first sidewall 130SW1 and a surface parallel to the main surface (X-Y plane) of the substrate 102 outside the resistive memory layer 130 having the first sidewall 130SW1, that is, a side nearby the first insulation pattern 122. According to some embodiments, the first included angle θ11 may be selected within a range from about 80° to about 88°, but embodiments of the inventive concept are not limited thereto. According to some embodiments, a sidewall opposite the first sidewall 130SW1, that is the sidewall contacting the second insulation pattern 126 is generally non-sloped and may extend in a direction perpendicular to the main surface (X-Y plane).

A second included angle θ12, which is the angle between the second sidewall 130SW2 and a horizontal plane parallel to the main surface (X-Y plane) of the substrate 102, may be an obtuse angle. The second included angle θ12 may be an angle between the second sidewall 130SW2 and a horizontal surface parallel to the main surface (X-Y plane) of the substrate 102 outside the resistive memory layer 130, that is, a side nearby the third insulation pattern 128.

Therefore, the first sidewall 130SW1 and the second sidewall 130SW2 of the resistive memory layer 130 may be sloped in different directions, with respect to the resistive memory layer 130.

The horizontal width of the first sidewall 130SW1 may decrease in a direction away from the substrate 102. The horizontal width of the second sidewall 130SW2 may increase in a direction away from the substrate 102.

The resistive memory layer 130 may include a phase change material that is reversibly changed between an amorphous state and a crystalline state according to heating times. For example, the phase of the resistive memory layer 130 may include a material that may be reversibly changed by Joule heat from a voltage applied to both ends of the resistive memory layer 130, wherein the resistance of the material may be changed due to such a change of phase.

According to some embodiments, the resistive memory layer 130 may include a chalcogenide material as a phase change material. According to some embodiments, the resistive memory layer 130 may include Ge—Sb—Te (GST). For example, the resistive memory layer 130 may include a material such as $Ge_2Sb_2Te_5$, $Ge_2Sb_2Te_7$, $Ge_1Sb_2Te_4$, and/or $Ge_1Sb_4Te_7$. The resistive memory layer 130 may include various chalcogenide materials in addition to the GST described above. For example, the resistive memory layer 130 may include a chalcogenide material including at least two elements selected from among Si, Ge, Sb, Te, Bi, In, Sn, and Se. According to some embodiments, the resistive memory layer 130 may further include at least one impurity selected from among B, C, N, O, P, and S. The operating current of the memory device 100 may be changed by the at least one impurity. Furthermore, the resistive memory layer 130 may further include a metal. For example, the resistive memory layer 130 may include a material selected from among Al, Ga, Zn, Ti, Cr, Mn, Fe, Co, Ni, Mo, Ru, Pd, Hf, Ta, Ir, Pt, Zr, Tl, Pd, and Po. According to some embodiments, the resistive memory layer 130 may have a multi-layer structure in which two or more layers having different physical properties are stacked. The number or thicknesses of a plurality of layers constituting the multi-layer structure may vary in different embodiments of the inventive concept. For example, the resistive memory layer 130 may have a superlattice structure in which a plurality of layers including different materials are alternately stacked.

Materials constituting the resistive memory layer 130 are not limited to phase change materials. The resistive memory layer 130 may include various materials having resistance-changing characteristics. According to some embodiments, the resistive memory layer 130 may include a transition metal oxide. In this case, the memory device 100 may constitute a resistive RAM (ReRAM) device. According to some other embodiments, the resistive memory layer 130 may have a magnetic tunnel junction (MTJ) structure including two magnetic electrodes and a dielectric body interposed between the two magnetic electrodes. In this case, the memory device 100 may constitute a magnetic RAM (MRAM).

Referring to FIGS. 3A and 3C, the selecting device structure SS may include the second electrode layer 140, the select device layer 150, and the third electrode layer 160.

The select device layer 150 may include a third sidewall 150SW. The third sidewall 150SW may be a sloped sidewall. A third included angle θ21, which is the angle between the third sidewall 150SW and a horizontal plane parallel to the main surface (X-Y plane) of the substrate 102, may be an obtuse angle. Here, the third included angle θ21 may be an angle between the third sidewall 150SW and a horizontal surface parallel to the main surface (X-Y plane) of the substrate 102 outside the select device layer 150, that is, a side nearby the insulation film 165. Angles between all of the sidewalls of the select device layer 150 and the horizontal plane parallel to the main surface (X-Y plane) of the substrate 102 may be third included angles θ21, which may be obtuse angles.

The sidewalls of the second electrode layer 140 and the third electrode layer 160 may also be sloped sidewalls similar to the third sidewall 150SW. In other words, sidewalls of the second electrode layer 140, the select device layer 150, and the third electrode layer 160 facing a same direction may form a continuous surface.

The horizontal width of the third sidewall 150SW may decrease in a direction away from the substrate 102. Therefore, the horizontal cross-sectional area of the selecting device structure SS including the select device layer 150 may decrease in a direction away from the substrate 102.

Referring to FIGS. 3A through 3C, the resistive memory layer 130 of the memory device 100 may have the first included angle θ11, which may be an acute angle between at least one sidewall of the resistive memory layer 130 and a horizontal plate parallel to the main surface (X-Y plane) of the substrate 102, and the third included angles θ21, which may be obtuse angles between the respective sidewalls of the select device layer 150 and the horizontal plate parallel to the main surface (X-Y plane) of the substrate 102.

Figure 4:
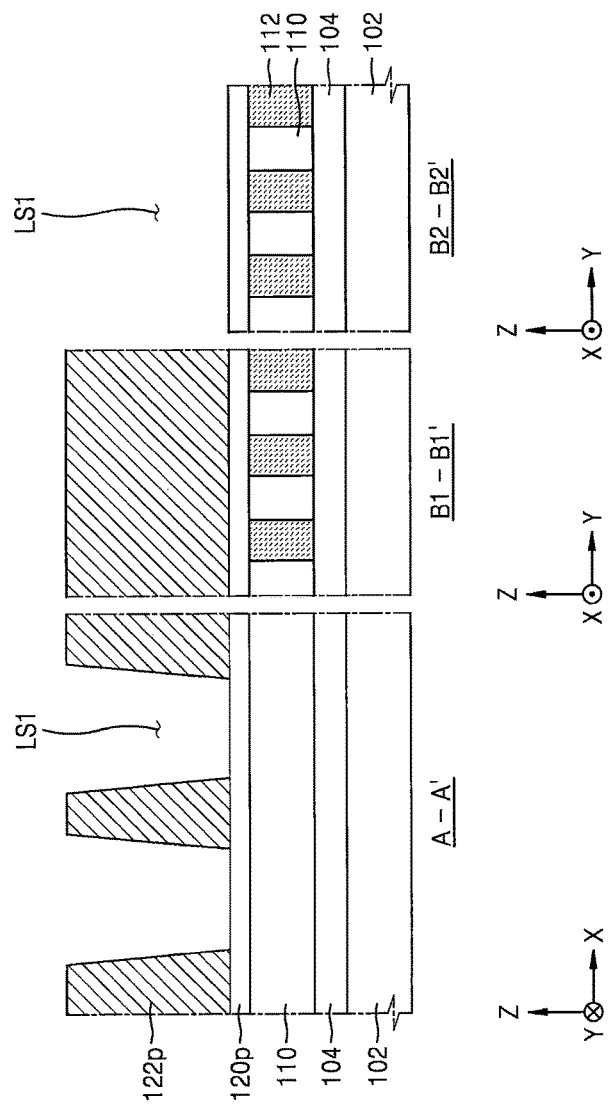
FIGS. 4, 5A, and 6 through 15 are cross-sectional view diagrams that illustrate methods of manufacturing a memory device according to some embodiments of the inventive concept.
Figure 5A:
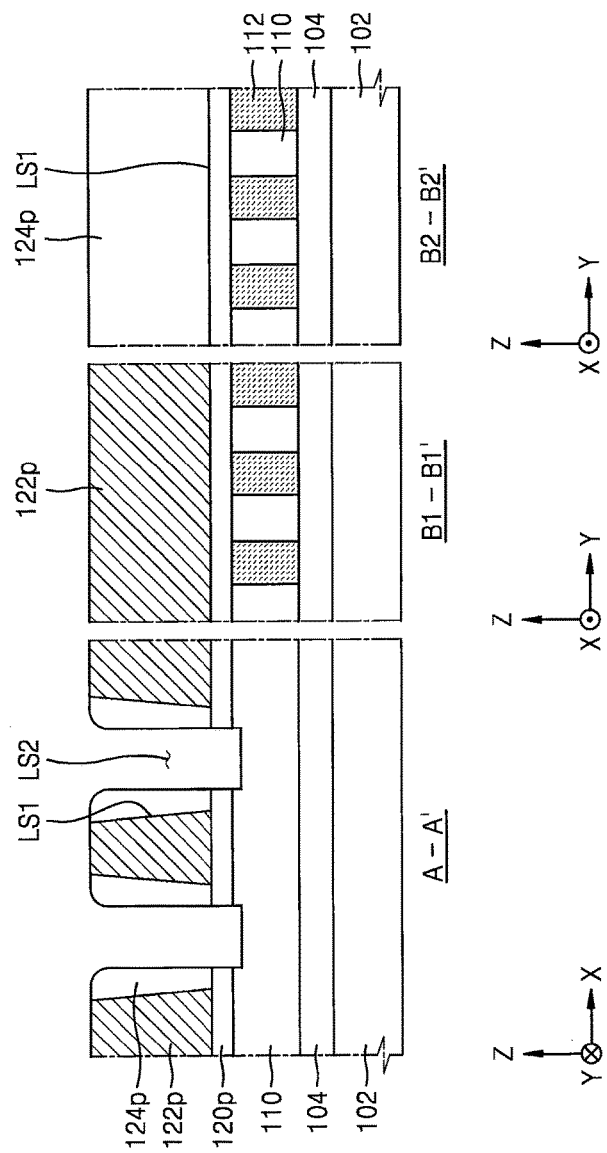
Figure 5B:
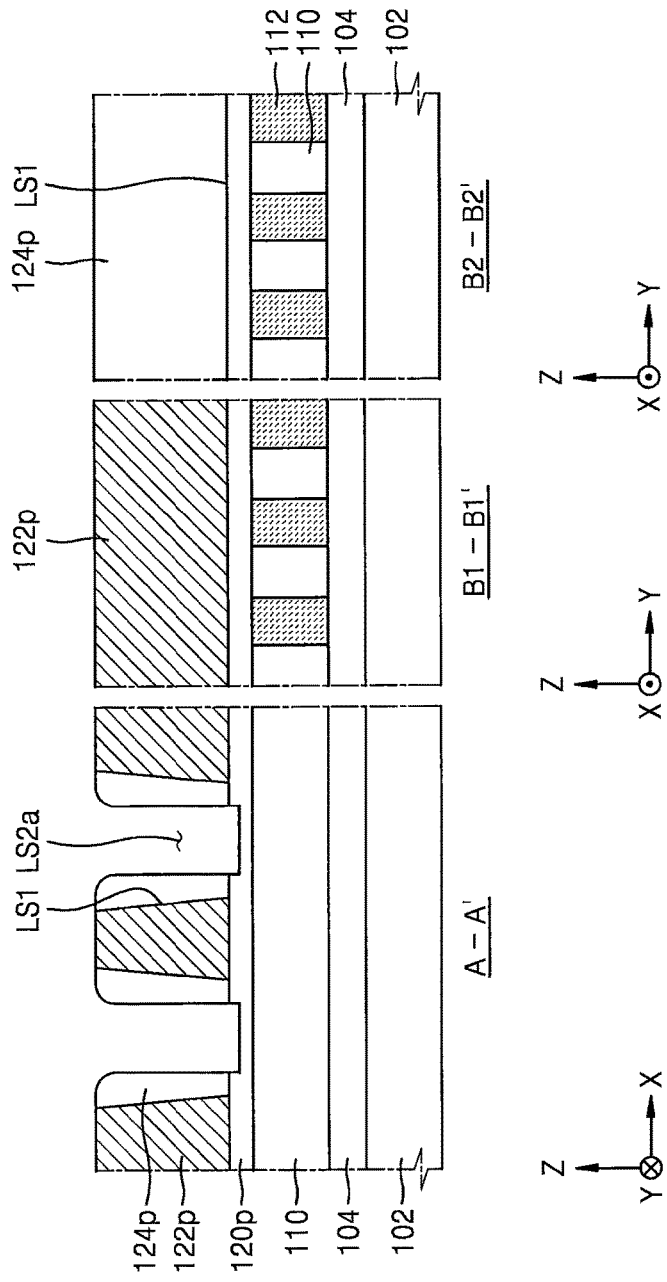
FIG. 5B is a cross-sectional view diagram that illustrates methods of manufacturing a memory device according to further embodiments of the inventive concept.
Figure 5C:
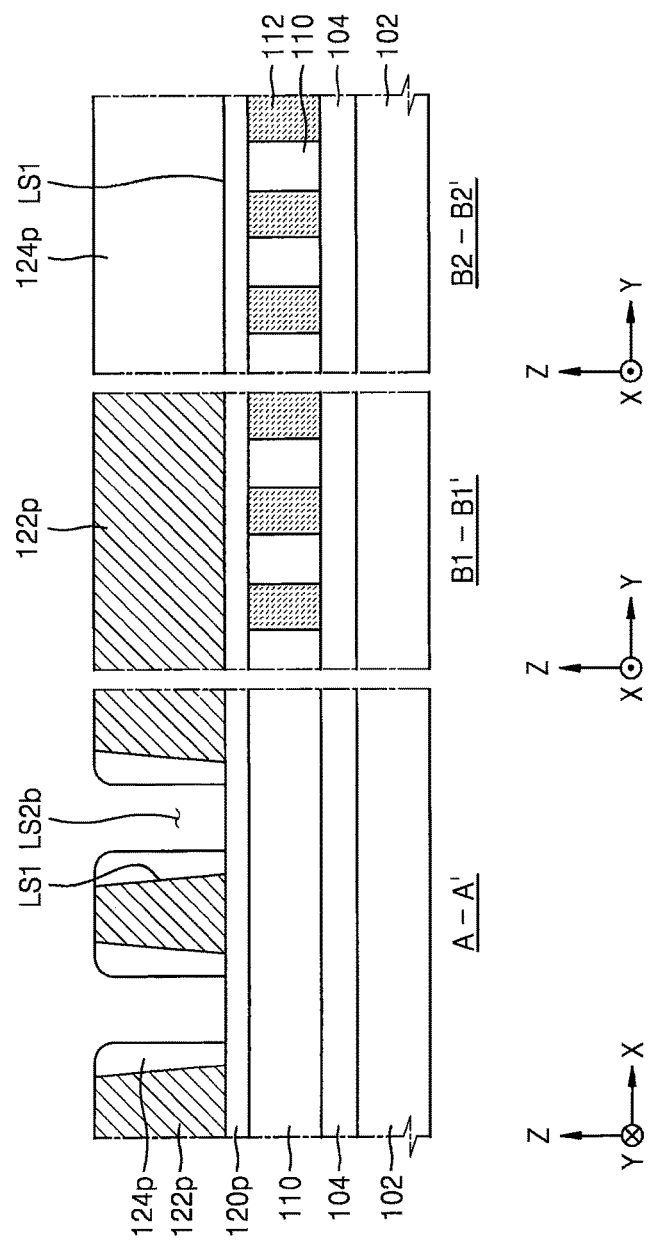
FIG. 5C is a cross-sectional view diagram that illustrates methods of manufacturing a memory device according to still further embodiments of the inventive concept.

FIGS. 4, 5A, and 6 through 15 are cross-sectional view diagrams that illustrate methods of manufacturing a memory device according to some embodiments of the inventive concept, FIG. 5B is a cross-sectional view diagram that illustrates methods of manufacturing a memory device according to further embodiments of the inventive concept, and FIG. 5C is a cross-sectional view diagram that illustrates methods of manufacturing a memory device according to still further embodiments of the inventive concept.

Referring to FIG. 4, the interlayer insulation film 104 is formed on the substrate 102 and the plurality of first conductive lines 110 are formed on the interlayer insulation film 104. The interlayer insulation film 104 may electrically isolate the plurality of first conductive lines 110 from the substrate 102.

The plurality of first conductive lines 110 may be formed to extend in parallel with one another along the first direction (X direction). The plurality of first separating insulation patterns 112 may be formed between the plurality of first conductive lines 110. According to some embodiments, after the plurality of first conductive lines 110 are formed, the plurality of first separating insulation patterns 112 may be formed to fill spaces between the plurality of first conductive lines 110. According to some embodiments, after the plurality of first separating insulation patterns 112 are formed, the plurality of first conductive lines 110 filling spaces between the plurality of first separating insulation patterns 112 may be formed.

A first preliminary electrode layer 120p covering the plurality of first conductive lines 110 and the plurality of first separating insulation patterns 112 is formed, and a plurality of first preliminary insulation patterns 122p are formed on the first preliminary electrode layer 120p. The plurality of first preliminary insulation patterns 122p may be formed by forming a first insulation layer covering the first preliminary electrode layer 120p and patterning the first insulation layer. The plurality of first preliminary insulation patterns 122p may be line-shaped patterns extending in parallel with one another along the second direction (Y direction). First linear spaces LS1 may be defined between the plurality of first preliminary insulation patterns 122p.

Referring to FIG. 5A, a spacer layer 124p covering the sidewalls of each of the plurality of first preliminary insulation patterns 122p is formed. The spacer layer 124p may be formed by forming a preliminary spacer layer conformally covering the first preliminary electrode layer 120p and then partially removing the preliminary spacer layer through an etchback process. The spacer layer 124p may include a material having an etching selectivity ratio with the plurality of first preliminary insulation patterns 122p. The preliminary spacer layer may include, for example, an oxide formed through an atomic layer deposition (ALD) method.

During the etchback process for forming the spacer layer 124p, a portion of the first preliminary electrode layer 120p may also be removed together, and, thus, the first conductive line 110 may be partially exposed. A second linear space LS2 may be defined between a pair of spacer layers 124p facing each other. The first conductive lines 110 may be exposed on the bottom surface of the second linear space LS2.

Referring to FIG. 5B, the spacer layers 124p covering the sidewalls of the plurality of first preliminary insulation patterns 122p are formed. A second linear space LS2a may be defined between a pair of spacer layers 124*p* facing each other. A portion of the first preliminary electrode layer 120*p* may be exposed on the bottom surface of the second linear space LS2*a*. During the etchback process for forming the spacer layer 124*p*, a portion of the first preliminary electrode layer 120*p* may also be removed together, and, thus, the bottom surface of the second linear space LS2*a* may be at a lower level than the top of the first preliminary electrode layer 120*p* relative to the substrate 102.

Referring to FIG. 5C, the spacer layers 124*p* covering the sidewalls of the plurality of first preliminary insulation patterns 122*p* are formed. A second linear space LS2*b* may be defined between a pair of spacer layers 124*p* facing each other. A portion of the first preliminary insulation patterns 122*p* may be exposed on the bottom surface of the second linear space LS2*b*. The bottom surface of the second linear space LS2*b* and the top surface of the first preliminary electrode layer 120*p* may extend on a same plane.

Figure 6:
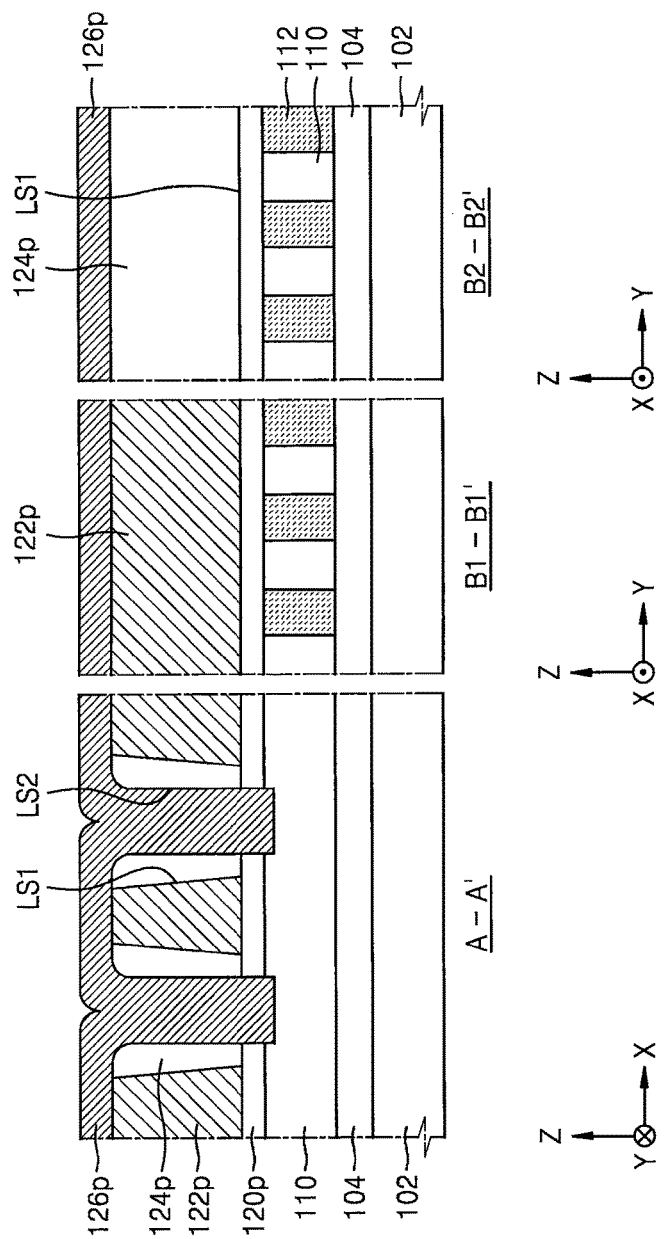

Referring to FIG. 6, a second insulation layer 126*p* filling the second linear space LS2 and covering the top surfaces of the first preliminary insulation pattern 122*p* and the spacer layer 124*p* is formed. The second insulation layer 126*p* may include a material having etching selectivity with respect to the spacer layer 124*p* and an etching property similar to that of the first preliminary insulation pattern 122*p*.

Figure 7:
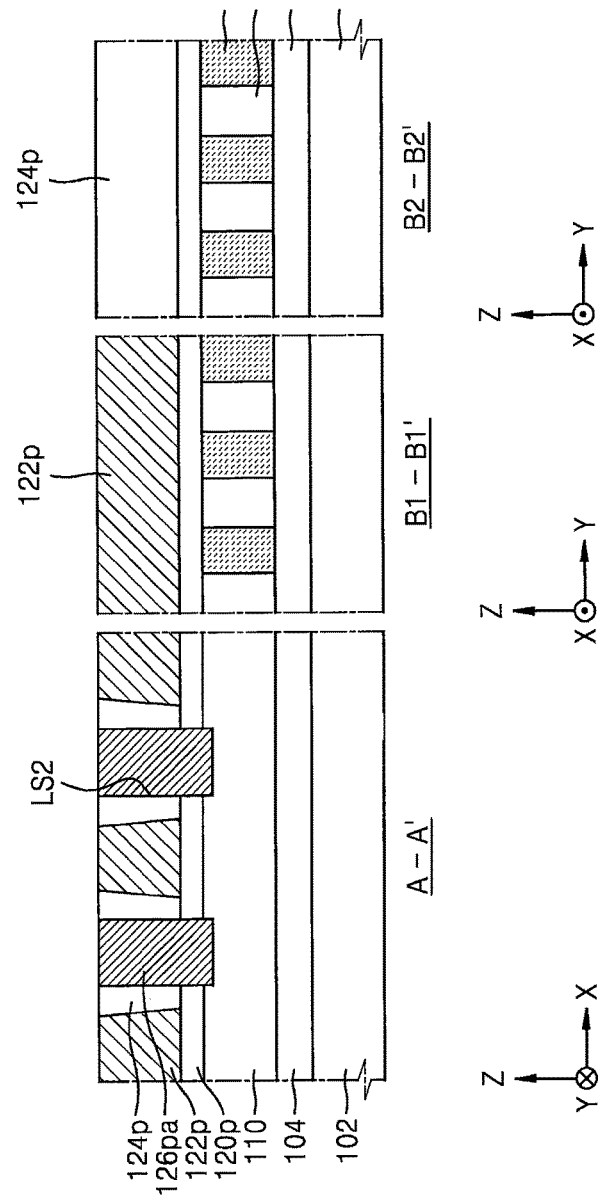

Referring to FIGS. 6 and 7, portions of the second insulation layer 126*p* and the portion covering the top surfaces of the first preliminary insulation pattern 122*p* and the spacer layer 124*p* are removed, thereby forming a second preliminary insulation pattern 126*pa* filling the second linear space LS2. The second preliminary insulation pattern 126*pa* may be formed, for example, through an etchback process or a chemical mechanical polishing (CMP) process. According to some embodiments, during the formation of the second preliminary insulation pattern 126*pa*, upper portions of the first preliminary insulation pattern 122*p* and the spacer layer 124*p* may also be partially removed, and, thus, the heights of the first preliminary insulation pattern 122*p* and the spacer layer 124*p* may be reduced.

The top surface of the first preliminary insulation pattern 122*p*, the top surface of the spacer layer 124*p*, and the top surface of the second preliminary insulation pattern 126*pa* may extend on a same plane.

Figure 8:
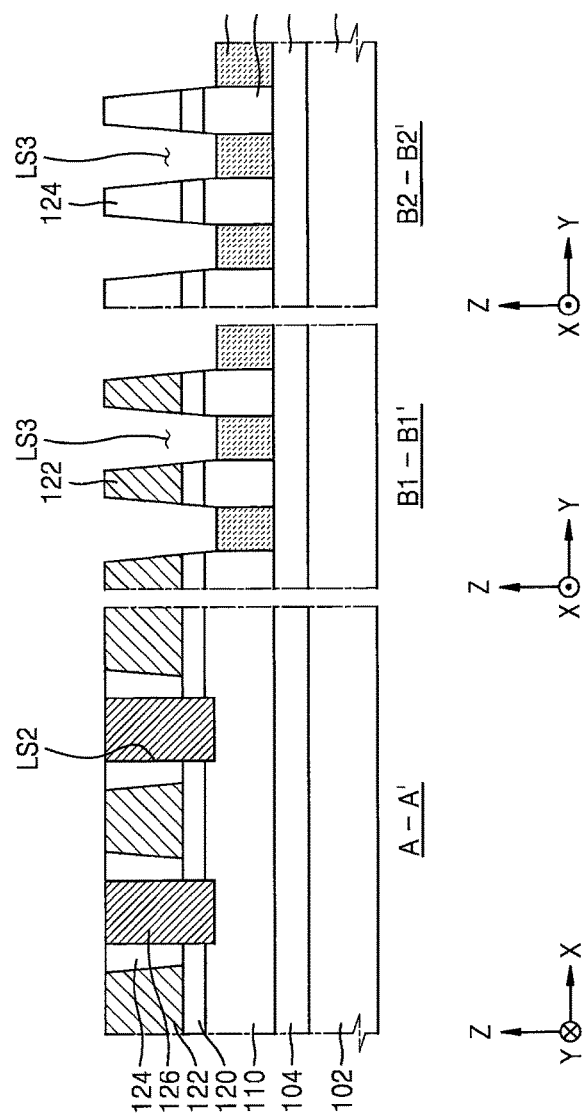

Referring to FIGS. 7 and 8, the first preliminary electrode layer 120*p*, the first preliminary insulation pattern 122*p*, the spacer layer 124*p*, and the second preliminary insulation pattern 126*pa* are patterned together, thereby forming the first electrode layer 120, the first insulation pattern 122, a spacer pattern 124, and the second insulation pattern 126. According to some embodiments, processes for patterning the first preliminary insulation pattern 122*p*, the spacer layer 124*p*, and the second preliminary insulation pattern 126*pa* and a process for patterning the first preliminary electrode layer 120*p* may be performed separately.

The first electrode layer 120, the first insulation pattern 122, the spacer pattern 124 and the second insulation pattern 126 may constitute a plurality of line-shaped patterns extending in parallel with one another along the first direction (X direction). Third linear spaces LS3 may be defined between the plurality of line-shaped patterns including the first electrode layer 120, the first insulation pattern 122, the spacer pattern 124, and the second insulation pattern 126. The first separating insulation pattern 112 may be exposed on the bottom surface of the third linear space LS3. An upper portion of the first separating insulation pattern 112 may also be partially removed during the process for patterning the first preliminary electrode layer 120*p*, the first preliminary insulation pattern 122*p*, the spacer layer 124*p*, and the second preliminary insulation pattern 126*pa*, and, thus, the bottom surface of the third linear space LS3 may be at a lower level than the top of the first separating insulation pattern 112 relative to the substrate 102.

Figure 9:
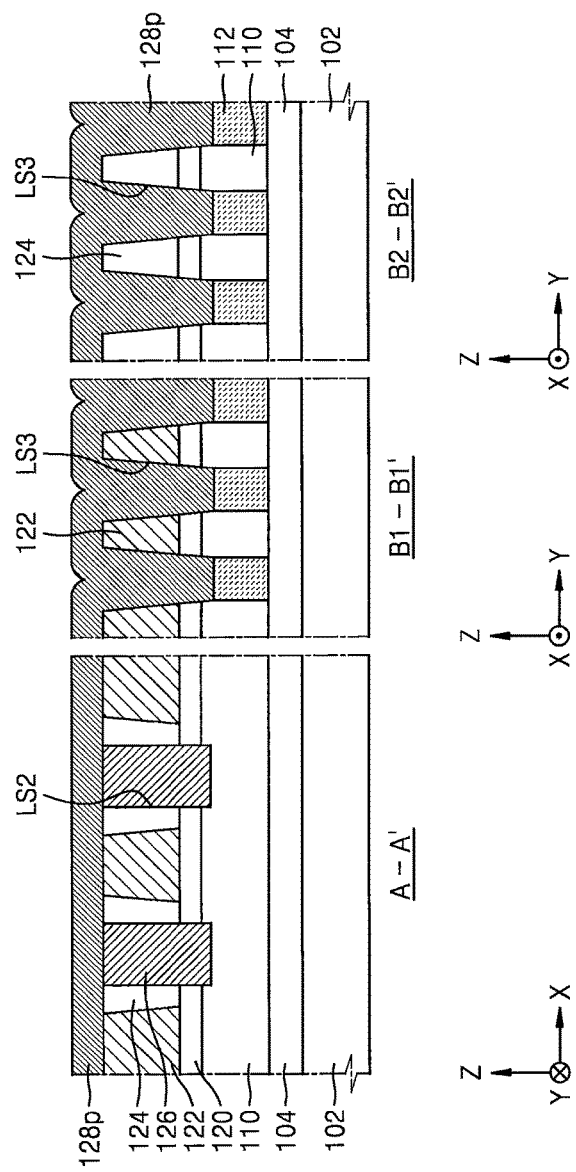

Referring to FIG. 9, a third insulation layer 128*p* that fills the third linear space LS3 and covers the top surfaces of the first insulation pattern 122, the spacer pattern 124, and the second insulation pattern 126 is formed. The third insulation layer 128*p* may include a material having etching selectivity with respect to the spacer pattern 124 and an etching property similar to those of the first insulation pattern 122 and the second insulation pattern 126.

Figure 10:
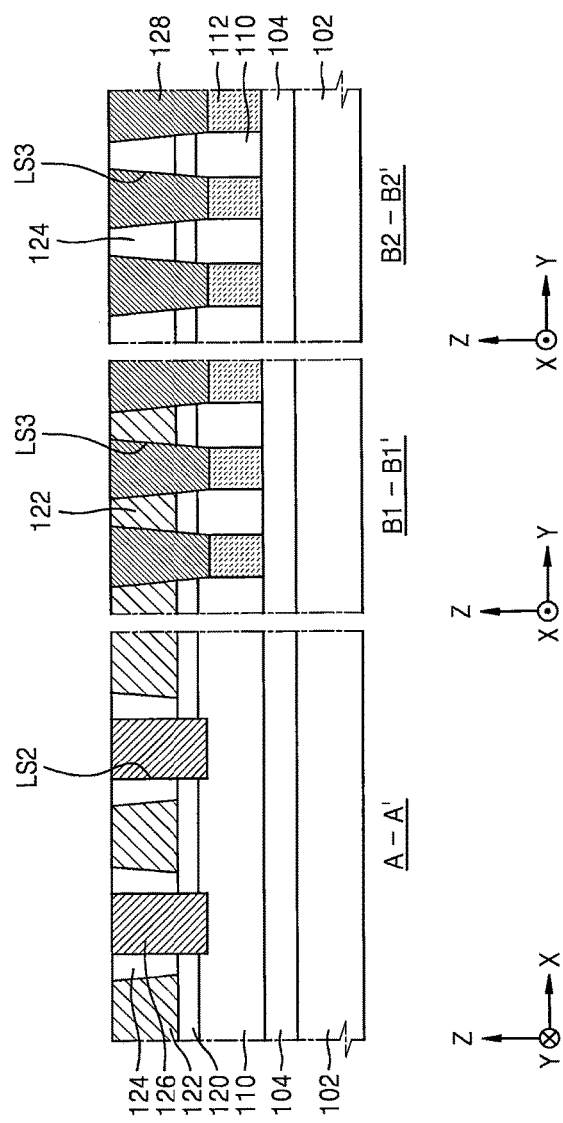

Referring to FIGS. 9 and 10, portions of the third insulation layer 128*p* covering the top surfaces of the first insulation pattern 122, the spacer pattern 124, and the second insulation pattern 126 are removed, thereby forming the third insulation pattern 128 filling the third linear space LS3. The third insulation pattern 128 may be formed, for example, through an etchback process or a CMP process. According to some embodiments, during the formation of the third insulation pattern 128, upper portions of the first insulation pattern 122, the spacer pattern 124, and the second insulation pattern 126 may also be partially removed, and, thus, the heights of the first insulation pattern 122, the spacer pattern 124, and the second insulation pattern 126 may be reduced.

The top surface of the first insulation pattern 122, the top surface of the spacer pattern 124, the top surface of the second insulation pattern 126, and the top surface of the third insulation pattern 128 may extend on a same plane.

Figure 11:
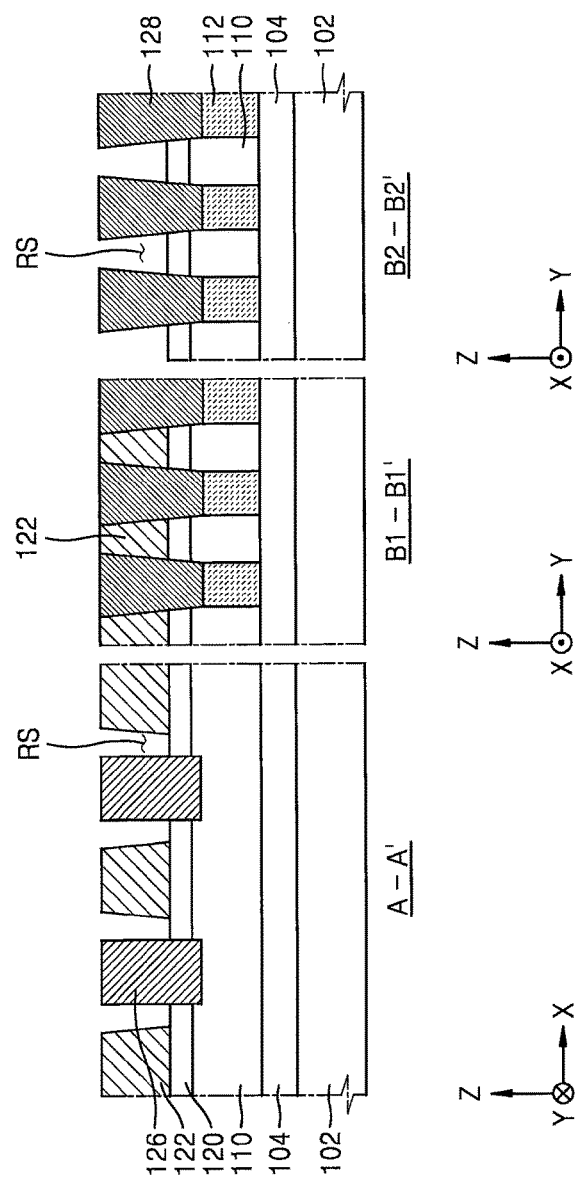

Referring to FIGS. 10 and 11, the spacer pattern 124 is removed. The spacer pattern 124 may be removed by, for example, performing a wet etching process using an etching selectivity with respect to the first insulation pattern 122, the second insulation pattern 126, and the third insulation pattern 128. A recessed space RS is defined at a location from which the spacer pattern 124 is removed. The recessed space RS is defined by the first insulation pattern 122, the second insulation pattern 126, and the third insulation pattern 128, and the first electrode layer 120 may be exposed on the bottom surface of the recessed space RS.

Figure 12:
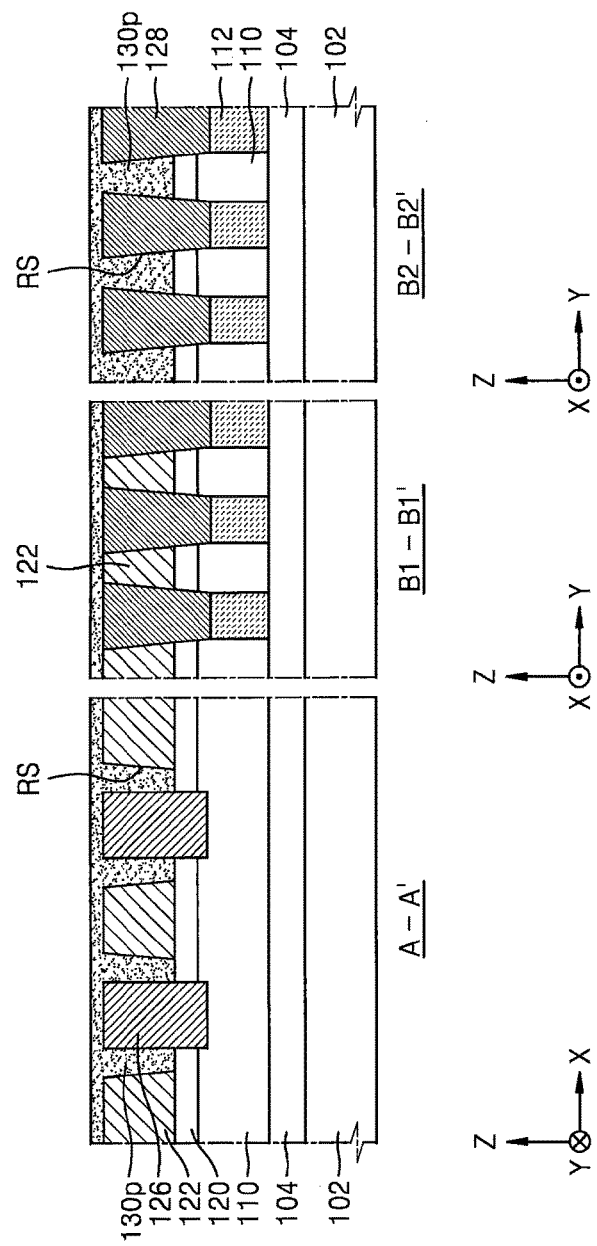

Referring to FIG. 12, a preliminary resistive memory layer 130*p* that fills the recessed space RS and covering the top surfaces of the first insulation pattern 122, the second insulation pattern 126, and the third insulation pattern 128 is formed.

Figure 13:
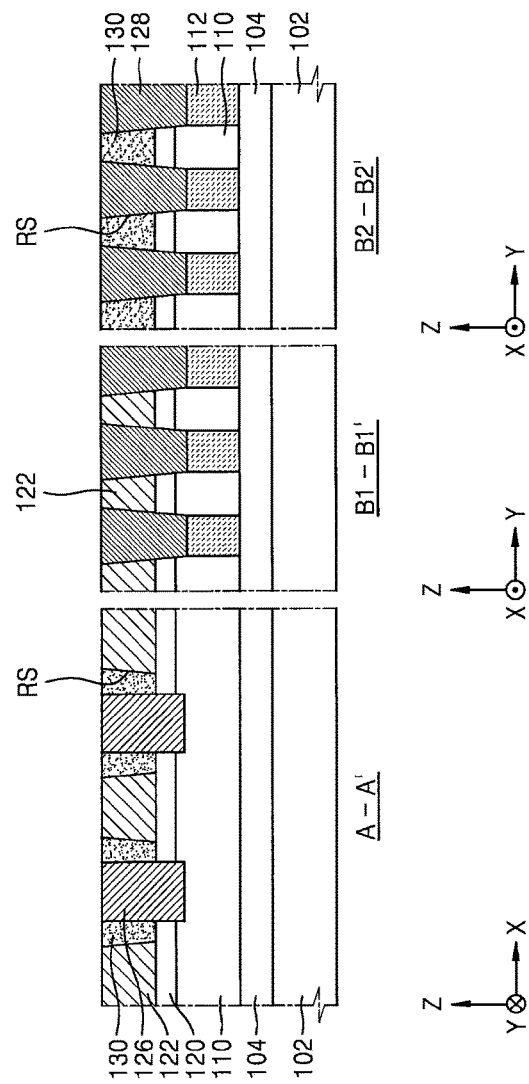

Referring to FIGS. 12 and 13, portions of the preliminary resistive memory layer 130*p* covering the top surfaces of the first insulation pattern 122, the second insulation pattern 126, and the third insulation pattern 128 are removed, thereby forming the resistive memory layer 130 filling the recessed space RS. The resistive memory layer 130 may be formed, for example, through an etchback process or a CMP process.

According to some embodiments, during the formation of the resistive memory layer 130, upper portions of the first insulation pattern 122, the second insulation pattern 126, and the third insulation pattern 128 may also be partially removed, and, thus, the heights of the first insulation pattern 122, the second insulation pattern 126, and the third insulation pattern 128 may be reduced.

Figure 14:
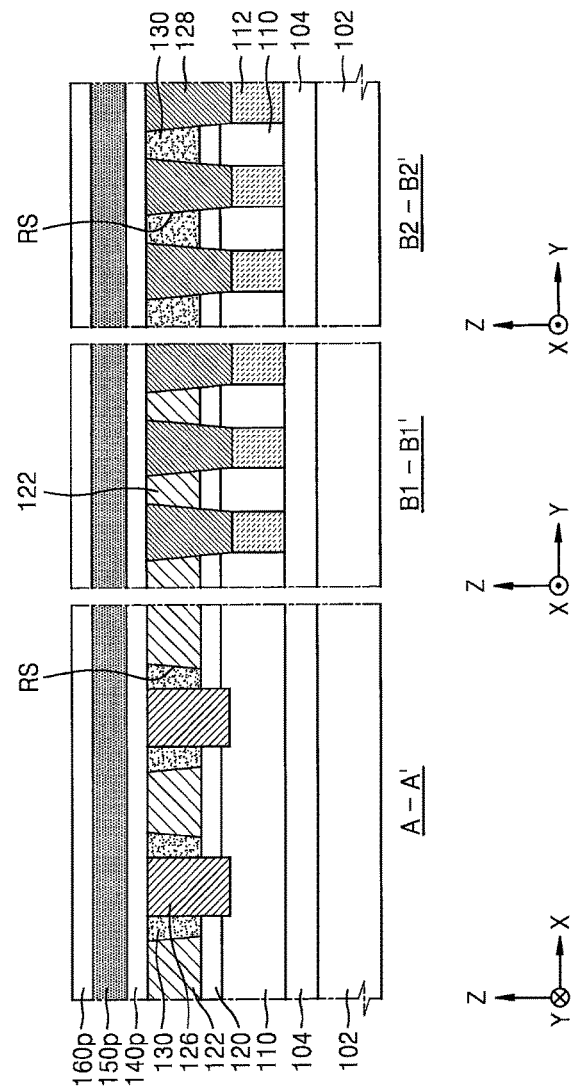

The top surface of the first insulation pattern 122, the top surface of the second insulation pattern 126, the top surface of the third insulation pattern 128, and the top surface of the resistive memory layer 130 may extend on a same plane Referring to FIG. 14, a second preliminary electrode layer 140p, a preliminary select device layer 150p, and third preliminary electrode layer 160p are sequentially formed over the first insulation pattern 122, the second insulation pattern 126, and the third insulation pattern 128.

Figure 15:
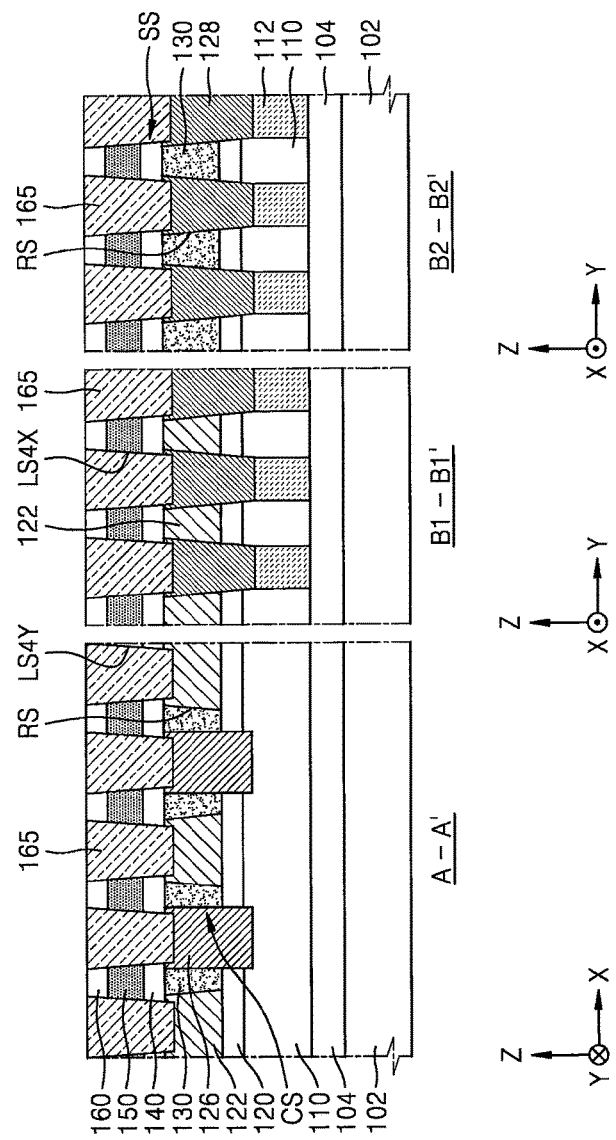

Referring to FIGS. 14 and 15, each of the second preliminary electrode layer 140p, the preliminary select device layer 150p, and the third preliminary electrode layer 160p is patterned along the first direction (X direction) and the second direction (Y direction), thereby forming the plurality of selecting device structures SS and the plurality of memory cell structures CS. The plurality of selecting device structures SS may have a matrix arrangement in which they are spaced apart from one another along the first direction (X direction) and the second direction (Y direction). Spaces between the plurality of selecting device structures SS may be filled with the insulation film 165.

Next, as shown in FIG. 3A, the plurality of second separating insulation patterns 175 may be formed to fill spaces between the plurality of second conductive lines 170, thereby forming the memory device 100.

Figure 16A:
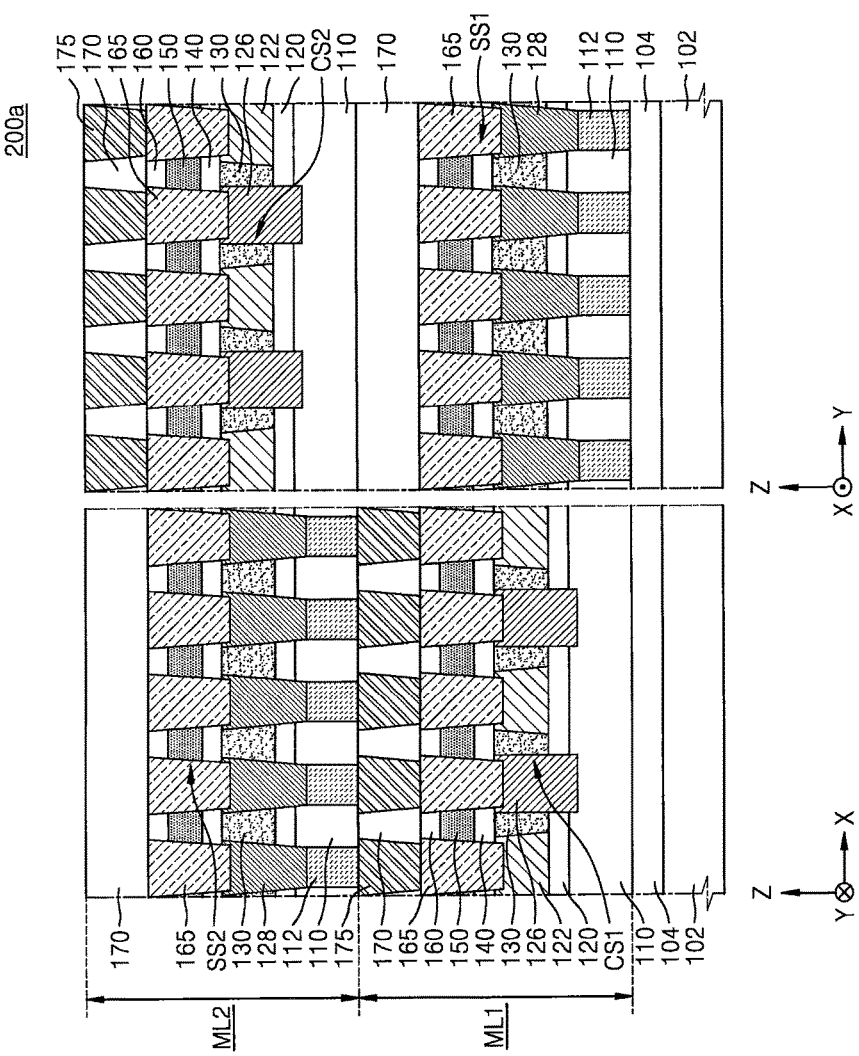
FIG. 16A is a cross-sectional view diagram that illustrates a memory device according to some embodiments of the inventive concept.

FIG. 16A is a cross-sectional view diagram that illustrates memory devices according to further embodiments of the inventive concept.

Referring to FIG. 16A, a memory device 200a may have a 3-dimensional cross-point stacked structure including the substrate 102, the interlayer insulation film 104 located on the substrate 102, a first memory layer ML1 located on the interlayer insulation film 104, and a second memory layer ML2 located on the first memory layer ML1.

Because the first memory layer ML1 of the memory device 200a may have components substantially identical to those arranged on the interlayer insulation film 104 in the memory device 100 described above with reference to FIGS. 3A, 5A, and 6 through 15, detailed descriptions thereof will be omitted.

The second memory layer ML2 of the memory device 200a has a structure in which the first direction (X direction) and the second direction (Y direction) for arranging the components on the interlayer insulation film 104 in the memory device 100 described above with reference to FIGS. 3A, 5A, and 6 through 15 are switched, and, thus, is substantially identical to the structure of the memory device 100. Therefore, a detailed description thereof will be omitted. In other words, the second memory layer ML2 may be located, in some embodiments, on the first memory layer ML2 in a vertical direction.

In the memory device 200a, the first memory layer ML1 may include a plurality of first memory cell structures CS1 and a plurality of first selecting device structures SS1, and the second memory layer ML2 may include a plurality of second memory cell structures CS2 and a plurality of second selecting device structures SS2. The plurality of first memory cell structures CS1 and the plurality of second memory cell structures CS2 may each include substantially the same components as the memory cell structure CS of the memory device 100 described with reference to FIGS. 3A, 5A, and 6 through 15. The plurality of first selecting device structures SS1 and the plurality of second selecting device structures SS2 may each include substantially the same components as the selecting device structures SS of the memory device 100 described with reference to FIGS. 3A, 5A, and 6 through 15.

According to some embodiments, in the memory device 200a, the first memory layer ML1 and the second memory layer ML2 may each include the plurality of first conductive lines 110 and the plurality of second conductive lines 170.

The plurality of second conductive lines 170 of the first memory layer ML1 and the plurality of first conductive lines 110 of the second memory layer ML2 may extend in parallel with each other along a same direction, that is, the second direction (Y direction), and the plurality of first conductive lines 110 of the second memory layer ML2 may be arranged over the plurality of second conductive lines 170 of the first memory layer ML1. Therefore, the plurality of first conductive lines 110 of the second memory layer ML2 and the plurality of second conductive lines 170 of the first memory layer ML1 may be substantially shared by the first memory layer ML1 and the second memory layer ML2.

According to some embodiments, in the memory device 200a, any one of the plurality of second conductive lines 170 of the first memory layer ML1 and the plurality of first conductive lines 110 of the second memory layer ML2 may be omitted. In these embodiments, the first memory layer ML1 and the second memory layer ML2 may share the other non-omitted one of the plurality of second conductive lines 170 of the first memory layer ML1 and the plurality of first conductive lines 110 of the second memory layer ML2.

In other words, the memory device 200a may have a 3-dimensional cross-point stacked structure in which the plurality of first conductive lines 110 and the plurality of second conductive lines 170 of the first memory layer ML1 and/or the plurality of first conductive lines 110 and the plurality of second conductive lines 170 of the second memory layer ML2 respectively function as a plurality of first conductive lines, a plurality of second conductive lines, and a plurality of third conductive lines and includes a plurality of first memory cell structures CS1 respectively arranged at intersections between the plurality of first conductive lines and the plurality of second conductive lines and a plurality of second memory cell structures CS2 respectively arranged at intersections between the plurality of second conductive lines and the plurality of third conductive lines.

The plurality of first selecting device structures SS1 connected to the plurality of first memory cell structures CS1 in series may be arranged at intersections between the plurality of first conductive lines and the plurality of second conductive lines, whereas the plurality of second selecting device structures SS2 connected to the plurality of second memory cell structures CS2 in series may be arranged at intersections between plurality of the second conductive lines and the plurality of third conductive lines.

The memory device 200a may apply signals to the first memory cell structure CS1 and the second memory cell structure CS2 in opposite directions, measure currents in opposite directions, and program the first memory cell structure CS1 and the second memory cell structure CS2 or read programmed information.

For example, when a signal is applied in a downward direction for programming the first memory cell structure CS1 of the first memory layer ML1, a signal is applied in an upward direction for programming the second memory cell structure CS2 of the second memory layer ML2.

In the memory device 200a according to an example embodiment, the first electrode layer 120 and the second electrode layer 140 may completely cover the bottom surface and the top surface of the resistive memory layer 130, respectively, electrodes of the first memory cell structure CS1 and the second memory cell structure CS2, that is, the first electrode layer 120 and the second electrode layer 140 may have symmetrical structures around the resistive memory layer 130. Therefore, even when signals are applied to the first memory cell structure CS and the second memory cell structure CS2 in opposite directions, when the first memory cell structure CS1 and the second memory cell structure CS2 are programmed by measuring currents in opposite directions, and programmed information are read, there may be little or no asymmetry between operating current levels of the first memory cell structure CS1 and the second memory cell structure CS2. As a result, the reliability of the memory device 200a having a 3-dimensional crosspoint stacked structure may be improved.

Although FIG. 16A shows that the memory device 200a includes two memory layers, that is, the first memory layer ML1 and the second memory layer ML2, embodiments of the inventive concept are not limited thereto, and the memory device 200a may include three or more memory layers.

Figure 16B:
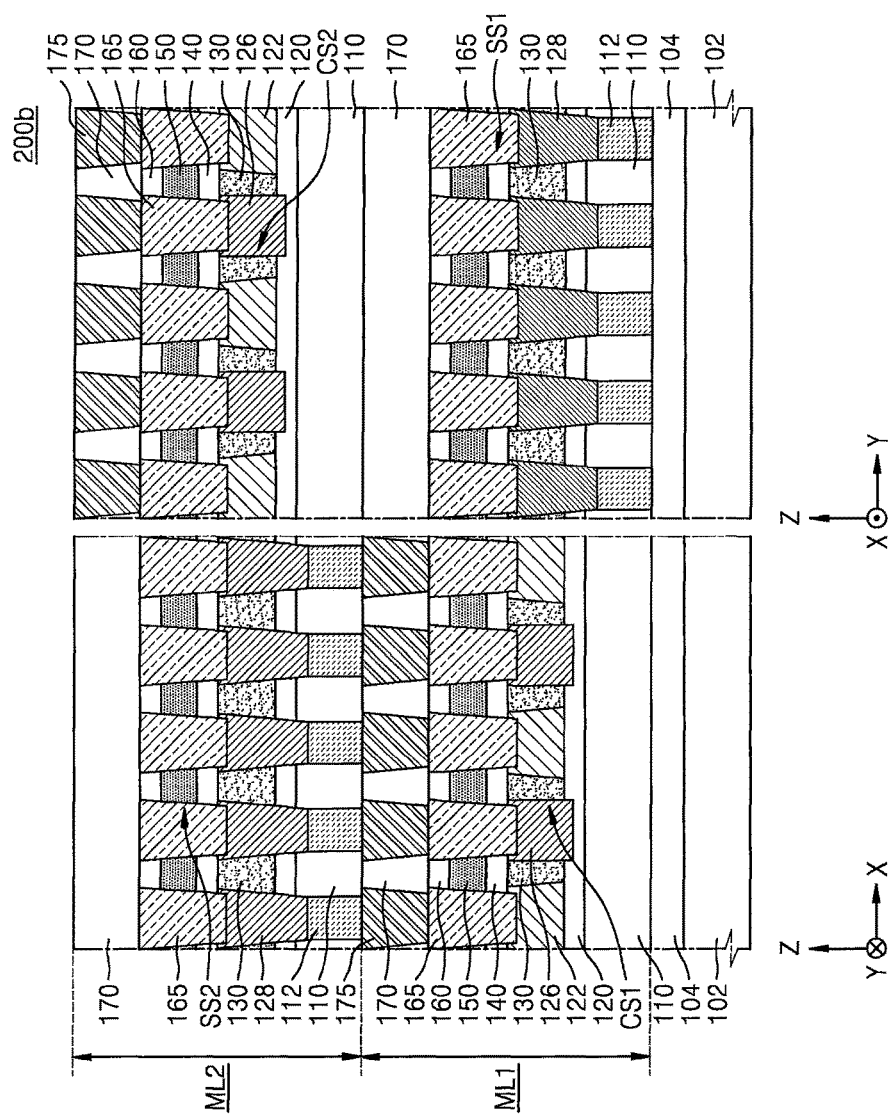
FIG. 16B is a cross-sectional view diagram that illustrates a memory device according to further embodiments of the inventive concept.

FIG. 16B is a cross-sectional view diagram that illustrates memory devices according to further embodiments of the inventive concept.

Referring to FIG. 16B, a memory device 200b may have a 3-dimensional cross-point stacked structure including the substrate 102, the interlayer insulation film 104 on the substrate 102, the first memory layer ML1 on the interlayer insulation film 104, and the second memory layer ML2 on the first memory layer ML1.

In the memory device 200a, according to the method embodiments described above with reference to FIG. 5B, the bottom surface of the second insulation pattern 126 is at a lower level than the top of the first electrode layer 120 relative to the substrate 102 and the bottom surface of the second insulation pattern 126 contacts the first electrode layer 120 instead of the first conductive line 110. Otherwise, the memory device 200b is similar to the memory device 200a described above with reference to FIG. 16A, and, thus, detailed description thereof will be omitted.

Figure 16C:
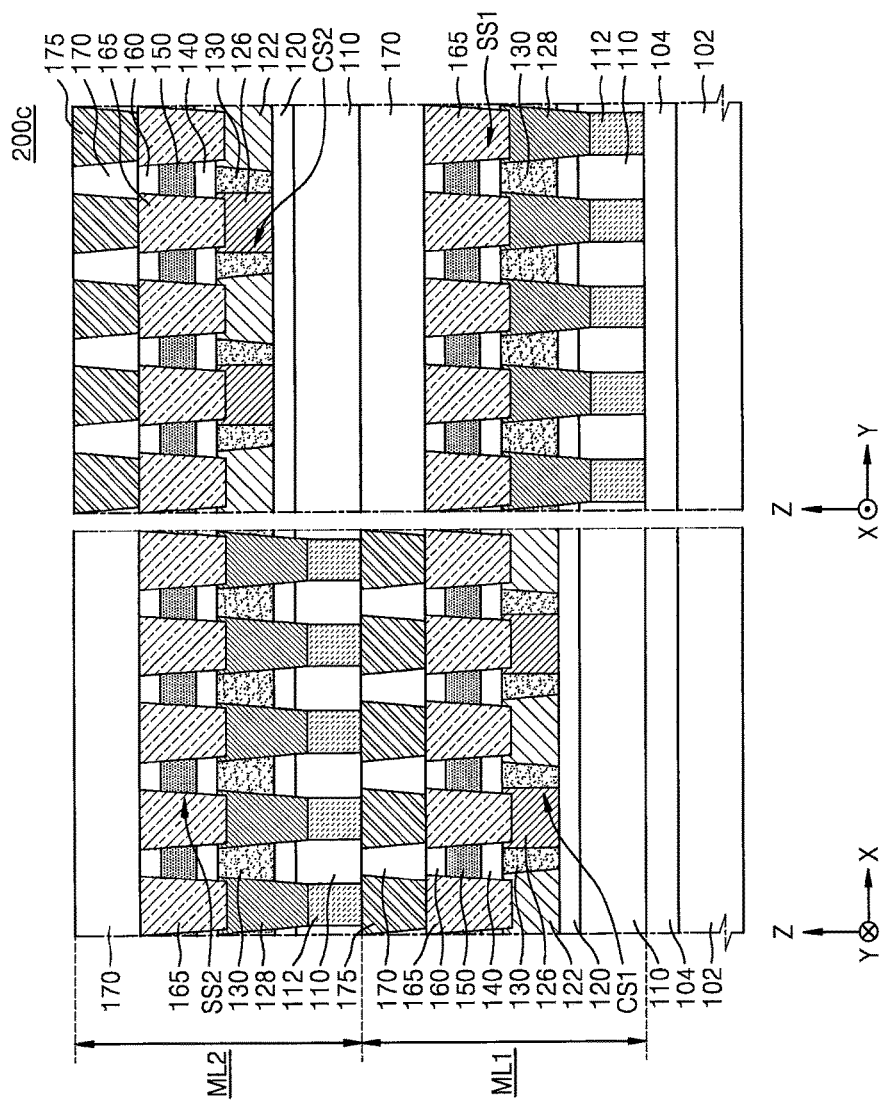
FIG. 16C is a cross-sectional view diagram that illustrates a memory device according to still further embodiments of the inventive concept.

FIG. 16C is a cross-sectional view diagram that illustrates a memory device according to further embodiments of the inventive concept.

Referring to FIG. 16C, a memory device 200c may have a 3-dimensional cross-point stacked structure including the substrate 102, the interlayer insulation film 104 located on the substrate 102, the first memory layer ML1 located on the interlayer insulation film 104, and the second memory layer ML2 located on the first memory layer ML1.

In the memory device 200c, according to the method embodiments described above with reference to FIG. 5B, the top of the first electrode layer 120 and the bottom surface of the second insulation pattern 126 extend on a same plane. Otherwise, the memory device 200c is similar to the memory device 200b described above with reference to FIG. 16B, and, thus, detailed description thereof will be omitted.

FIGS. 17 through 23 are cross-sectional view diagrams that illustrate methods of manufacturing a memory device according to some embodiments of the inventive concept. Descriptions identical to those given above with reference to FIGS. 4 through 15 may be omitted below.

Figure 17:
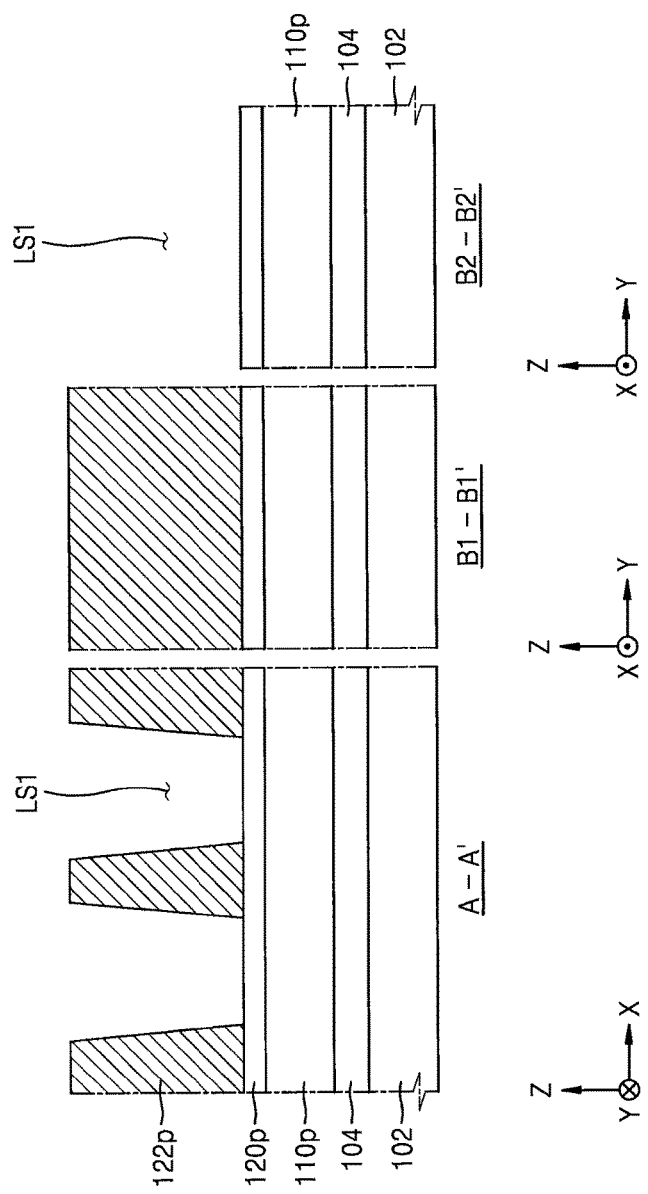
FIGS. 17 through 23 are cross-sectional view diagrams that illustrate methods of manufacturing a memory device according to some embodiments of the inventive concept.

Referring to FIG. 17, an interlayer insulation film 104, a first preliminary conductive layer 110p, the first preliminary electrode layer 120p, and the plurality of first preliminary insulation patterns 122p that defines the first linear space LS1 are sequentially formed on the substrate 102. The first preliminary conductive layer 110p may completely cover the top surface of the interlayer insulation film 104.

Figure 18:
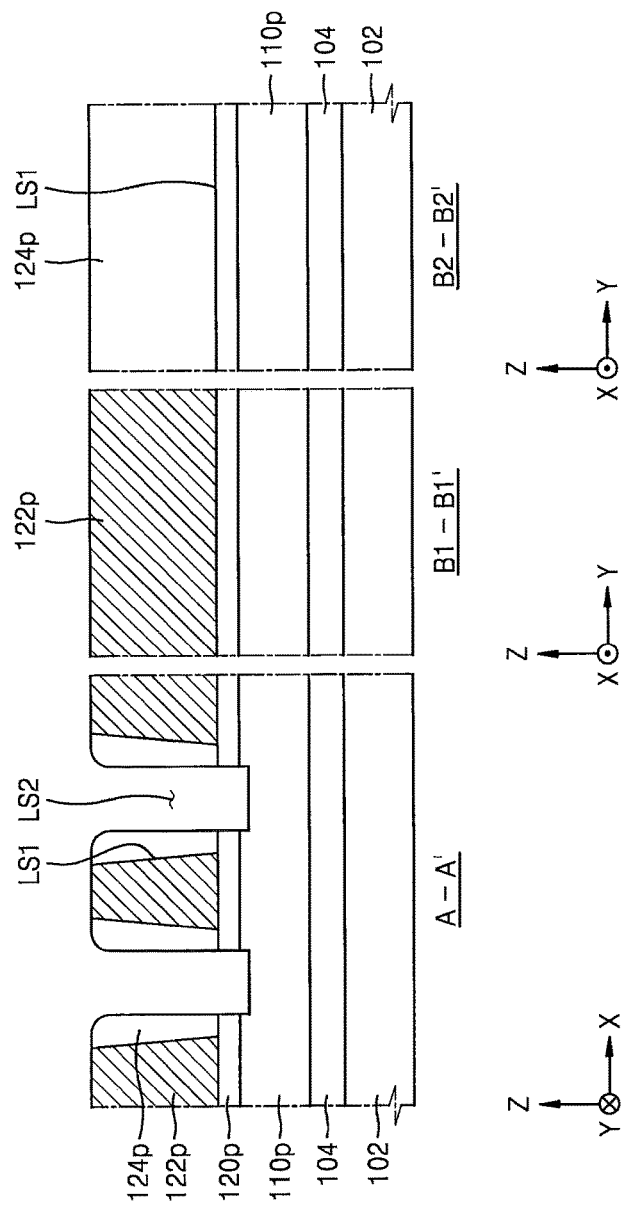

Referring to FIG. 18, in the same manner as the method embodiments described in FIG. 5A, the spacer layer 124p that defines the second linear space LS2 and covers sidewalls of the plurality of first preliminary insulation patterns 122p is formed.

Although not separately shown, the spacer layer 124p that defines the second linear space LS2a as described above with reference to FIG. 5B or the spacer layer 124p that defines the second linear space LS2b as described above with reference to FIG. 5C may also be formed.

Figure 19:
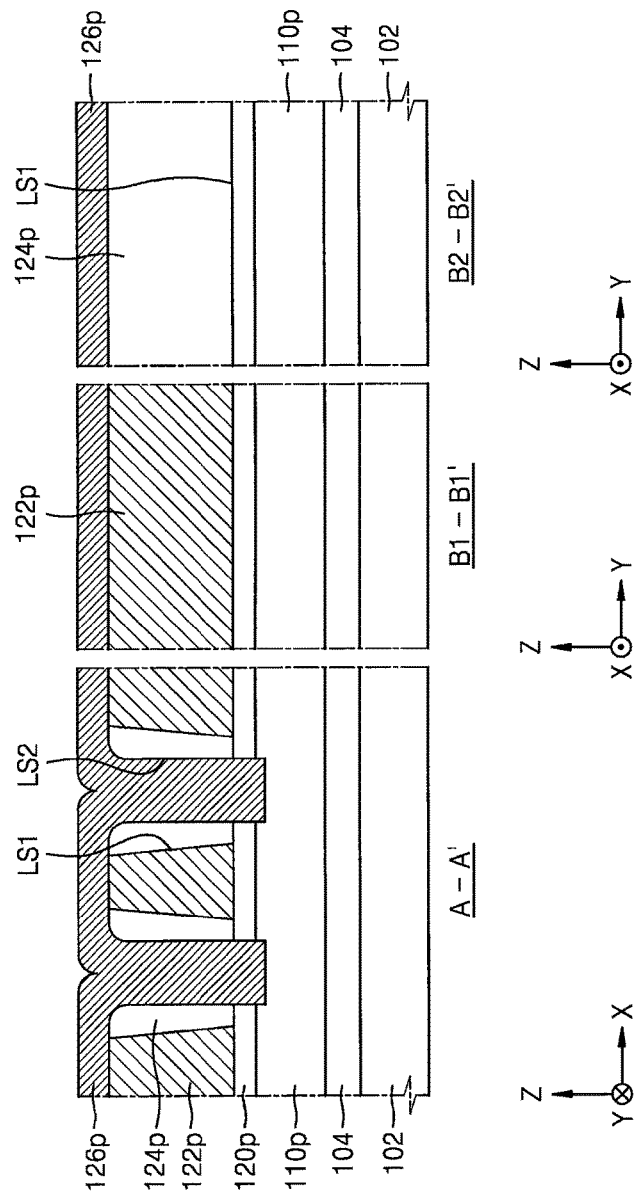

Referring to FIG. 19, the second insulation layer 126p filling the second linear space LS2 and covering the top surfaces of the first preliminary insulation pattern 122p and the spacer layer 124p is formed.

Figure 20:
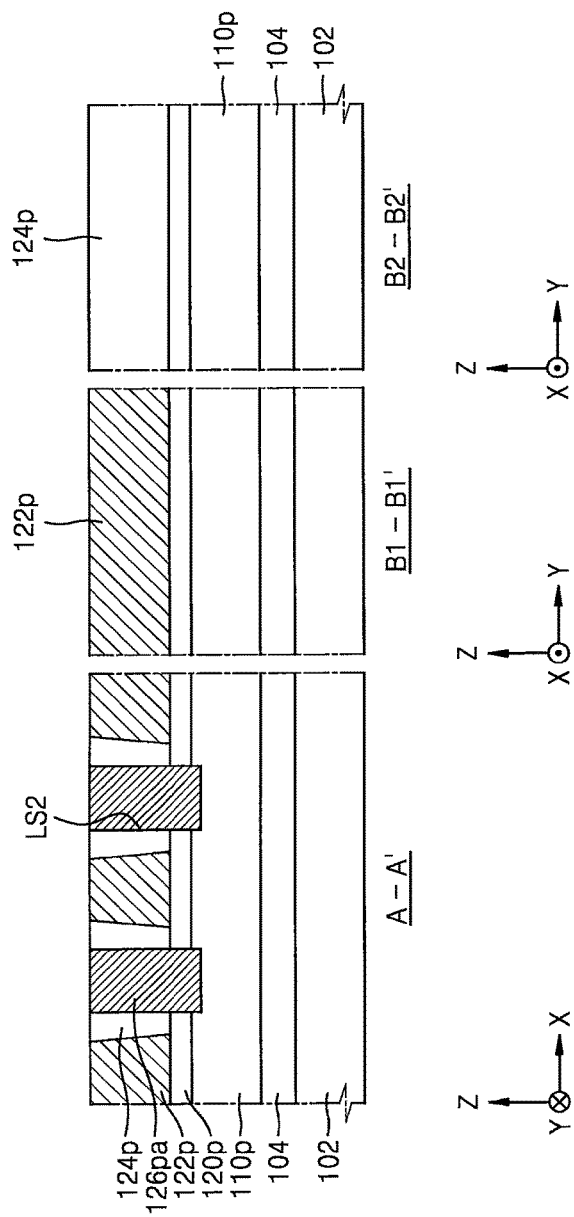

Referring to FIGS. 19 and 20, portions of the second insulation layer 126p covering the top surfaces of the first preliminary insulation pattern 122p and the spacer layer 124p are removed, thereby forming the second preliminary insulation pattern 125pa that fills the second linear space LS2.

Figure 21:
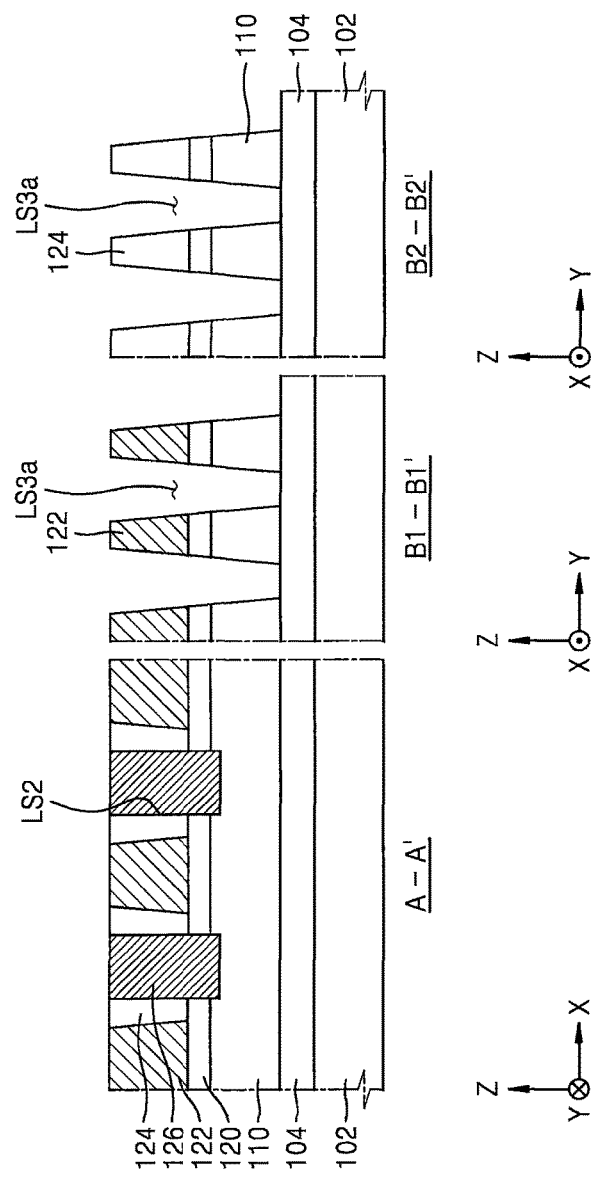

Referring to FIGS. 20 and 21, the first preliminary conductive layer 110p, the first preliminary electrode layer 120p, the first preliminary insulation pattern 122p, the spacer layer 124p, and the second preliminary insulation pattern 126pa are patterned together, thereby forming the first conductive line 110, the first electrode layer 120, the first insulation pattern 122, the spacer pattern 124, and the second insulation pattern 126. According to some embodiments, processes for patterning the first preliminary insulation pattern 122p, the spacer layer 124p, and the second preliminary insulation pattern 126pa and a process for patterning the first preliminary conductive layer 110p and the first preliminary electrode layer 120p may be performed separately.

The first conductive line 110, the first electrode layer 120, the first insulation pattern 122, the spacer pattern 124, and the second insulation pattern 126 may constitute a plurality of line-shaped patterns that extend in parallel with one another along the first direction (X direction). Third linear spaces LS3a may be defined between the plurality of line-shaped patterns including the first conductive line 110, the first electrode layer 120, the first insulation pattern 122, the spacer pattern 124, and the second insulation pattern 126. The interlayer insulation film 104 may be exposed on the bottom surface of the third linear space LS3a.

Figure 22:
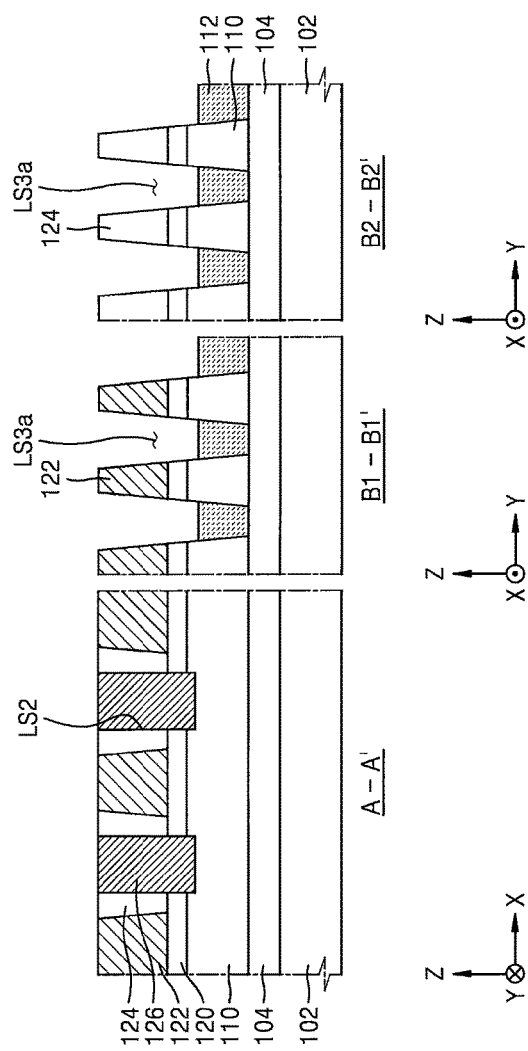

Referring to FIG. 22, the plurality of first separating insulation patterns 112 fills spaces between the plurality of first conductive lines 110 on a lower portion of the third linear space LS3a.

Figure 23:
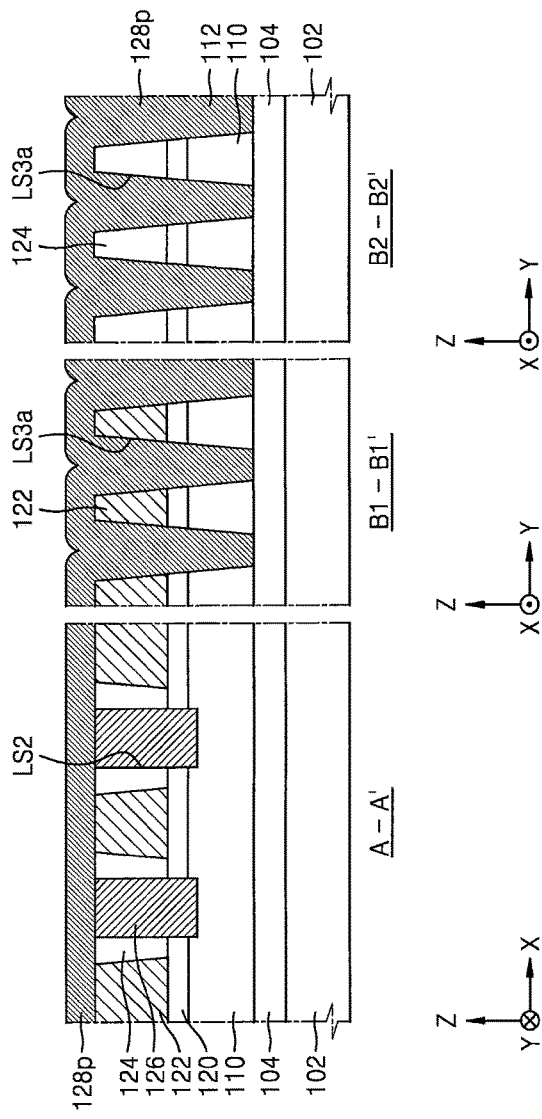

Referring to FIG. 23, the third insulation layer 128p, which completely fills the third linear space LS3a and covers the top surfaces of the first insulation pattern 122, the spacer pattern 124, and the second insulation pattern 126, is formed. Next, a memory device may be formed by performing the method embodiments described above with reference to FIGS. 10 through 15.

While the inventive concept has been particularly shown and described with reference to embodiments thereof, it will be understood that various changes in form and details may be made therein without departing from the spirit and scope of the following claims.

What is claimed is:
1. A memory device comprising:
    first conductive lines extending on a substrate along a first direction;
    second conductive lines extending on the first conductive lines along a second direction intersecting with the first direction; and
    memory cell structures, which are at intersections between the first conductive lines and the second conductive lines and connected to the first conductive lines and the second conductive lines, each of the memory cell structures comprising a first electrode layer, a second electrode layer, and a resistive memory layer between the first electrode layer and the second electrode layer, wherein a first sidewall of each of the resistive memory layers is sloped and has a horizontal width that decreases in a direction away from the substrate, and wherein a second sidewall of each of the resistive memory layers adjacent to the first sidewall is sloped and has a horizontal width that increases in the direction away from the substrate.

2. The memory device of claim 1, wherein the first sidewall and the second sidewall are sloped in different directions.

3. The memory device of claim 1, wherein the first electrode layers and the second electrode layers completely cover bottom surfaces and top surfaces of the resistive memory layers.

4. The memory device of claim 1, wherein a first included angle between the first sidewall and a horizontal plane parallel to a surface of the substrate is an acute angle, and a second included angle between the second sidewall and the horizontal plane is an obtuse angle.

5. The memory device of claim 1, wherein some of the resistive memory layers are spaced apart along the first direction, wherein the memory device further comprises:

first insulation patterns and second insulation patterns that are alternately arranged between the resistive memory layers.

6. The memory device of claim 5, wherein a pair of the resistive memory layers comprises one first insulation pattern interposed therebetween, the pair of the resistive memory layers and the one first insulation pattern being on one first electrode layer.

7. The memory device of claim 6, wherein top surfaces of the pair of the resistive memory layers having interposed therebetween the one first insulation pattern are covered by a pair of the second electrode layers arranged apart from one another.

8. The memory device of claim 6, further comprising third insulation patterns contacting the second sidewalls of the resistive memory layers, wherein the third insulation patterns are spaced apart along the first direction, and wherein the resistive memory layers are spaced apart along the first direction.

9. The memory device of claim 1, further comprising selecting device structures, which are connected to the memory cell structures in series between the first conductive lines and the second conductive lines, and respectively comprise the second electrode layer, a third electrode layer, and a select device layer between the second electrode layer and the third electrode layer, wherein each selecting device structure has sloped sidewalls, such that a horizontal cross-sectional area of the selecting device structure decreases in a direction away from the substrate.

10. The memory device of claim 9, wherein a third included angle between a sidewall of each selecting device structure and a horizontal plane parallel to a surface of the substrate is an obtuse angle.

11. A memory device comprising:

a first conductive line extending on a substrate along a first direction;

a pair of second conductive lines extending on the first conductive line along a second direction intersecting with the first direction;

a pair of memory cell structures, which are at intersections between the first conductive line and the pair of second conductive lines;

a first select device layer and a second select device layer on the pair of memory cell structures, respectively;

an insulation film interposed between the first select device layer and the second select device layer;

a first one of the pair of memory cell structures comprising a first resistive memory layer;

a second one of the pair of memory cell structures comprising a second resistive memory layer;

a first insulation pattern interposed between the first resistive memory layer and the second resistive memory layer; and a first electrode layer, which is shared by the pair of memory cell structures, and completely covers bottom surfaces of the first resistive memory layer and the second resistive memory layer;

wherein first included angles between sidewalls of the first resistive memory layer and the second select device layer contacting the first insulation pattern and a horizontal plane parallel to a surface of the substrate are acute angles, and wherein second included angles between sidewalls of the first select device layer and the second select device layer contacting the insulation film and the horizontal plane are obtuse angles.

12. The memory device of claim 11, wherein the sidewalls of the first resistive memory layer and the second resistive memory layer are sloped so as to become closer to each other in a direction away from the substrate.

13. The memory device of claim 12, further comprising:

a pair of selecting device structures, which are at the intersections between the first conductive line and the pair of second conductive lines and are respectively connected to the pair of memory cell structures in series;

a first one of the pair of selecting device structures comprising the first select device layer; and a second one of the pair of selecting device structures comprising the second select device layer;

wherein the sidewalls of the first select device layer and the second select device layer contacting the insulation film are sloped so as to become farther from each other in the direction away from the substrate.

14. The memory device of claim 12, wherein a horizontal width of the first insulation pattern decreases in the direction away from the substrate.

15. The memory device of claim 11, further comprising a pair of second electrode layers, which cover a top surface of the first resistive memory layer and a top surface of the second resistive memory layer, respectively, and are spaced apart from each other.

16. A memory device comprising:

first conductive lines extending on a substrate along a first direction;

second conductive lines extending on the first conductive lines along a second direction intersecting with the first direction;

third conductive lines extending on the second conductive lines along the first direction; and memory cell structures and selecting device structures, respectively comprising resistive memory layers and select device layers, at intersections between the first conductive lines and the second conductive lines and at intersections between the second conductive lines and the third conductive lines and connected to each other in series, wherein first sidewalls of the resistive memory layers are sloped sidewalls whose horizontal widths increase in a direction away from the substrate, wherein sidewalls of the select device layers are sloped sidewalls whose horizontal widths decrease in the direction away from the substrate; and wherein included angles between the first sidewalls of the resistive memory layers and a horizontal plane parallel to a surface of the substrate and included angles between the sidewalls of the select device layers and the horizontal plane are obtuse angles.

17. The memory device of claim 16, wherein included angles between at least one second sidewall of the resistive memory layers, adjacent to the first sidewalls of the resistive memory layers and the horizontal plane, are acute angles.

18. The memory device of claim 16, further comprising:
a first electrode layer and a second electrode layer respectively covering entire bottom surfaces and entire top surfaces of the resistive memory layers; and
the second electrode layer and a third electrode layer respectively covering entire bottom surfaces and entire top surfaces of the select device layers.

* * * * *